US008803244B2

(12) United States Patent
Mori

(10) Patent No.: US 8,803,244 B2
(45) Date of Patent: Aug. 12, 2014

(54) SEMICONDUCTOR DEVICE

(71) Applicant: Sony Corporation, Tokyo (JP)

(72) Inventor: Hideki Mori, Kanagawa (JP)

(73) Assignee: Sony Corporation, Tokyo (JP)

( * ) Notice: Subject to any disclaimer, the term of this patent is extended or adjusted under 35 U.S.C. 154(b) by 18 days.

(21) Appl. No.: 13/655,873

(22) Filed: Oct. 19, 2012

(65) Prior Publication Data

US 2013/0105911 A1    May 2, 2013

(30) Foreign Application Priority Data

Oct. 26, 2011  (JP) .................................. 2011-235046

(51) Int. Cl.
*H01L 27/088* (2006.01)

(52) U.S. Cl.
USPC ......................................................... 257/378

(58) Field of Classification Search
USPC ........... 257/47, 197, 205, 273, 351, 361, 362,
257/370, 373, 378, 423, 427, 474, 477, 498,
257/511, 517, 525, 526, 539, 542, 552,
257/555–557, 565, 575, E51.004, E31.069,
257/E27.015, E27.017, E27.019,
257/E27.02–E27.023, E27.03–E27.032,
257/E27.037–E27.039, E27.041–E27.043,
257/E27.053, E27.055, E27.063, E27.072,
257/E27.106, E27.109, E27.149, E29.03,
257/E29.033, E29.034, E29.036, E29.037,
257/E29.044, E29.114, E29.124, E29.169,
257/E29.171, E29.174, E29.182, E29.194,
257/E29.197, E29.281, E21.35, E21.372,
257/E21.38, E21.382, E21.383, E21.608,
257/E21.695, E21.696; 438/170, 189,
438/202–205, 234–236, 309, 313, 322, 325,
438/327, 336, 340

See application file for complete search history.

(56) References Cited

U.S. PATENT DOCUMENTS 5,397,913 A *  3/1995  Takata et al. ................... 257/567
2007/0241426 A1* 10/2007  Hiroshima et al. ........... 257/565

FOREIGN PATENT DOCUMENTS

JP           06-310526         11/1994

* cited by examiner

*Primary Examiner* — Fernando L Toledo
*Assistant Examiner* — Lawrence-Linh T Nguyen
(74) *Attorney, Agent, or Firm* — Dentons US LLP

(57) ABSTRACT

A semiconductor device includes a first conductivity type base formed on a surface of a substrate, a second conductivity type emitter formed on a surface of the base, a second conductivity type doped region which, along with accepting a first type of carrier from the emitter, injects the first type of carrier into the base, and is arranged to be spaced apart on the surface of the base from the emitter, and a second conductivity type collector which is formed on an opposite side to the emitter and the doped region, interposing the base.

14 Claims, 17 Drawing Sheets

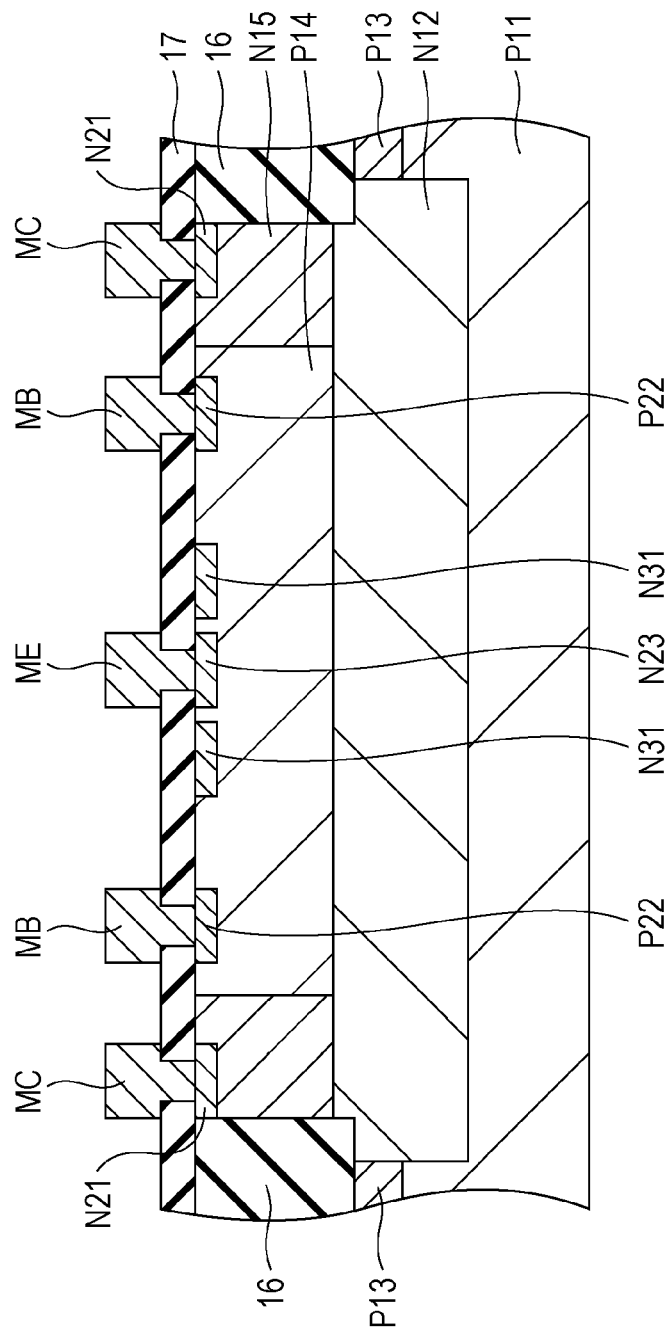

SEMICONDUCTOR DEVICE

BACKGROUND

The present disclosure relates to a semiconductor device, and particularly a bipolar transistor.

In recent years, numerous integrated circuits (IC) have been mounted in electronic devices and have contributed to increasing compactness and multi-functionality of the electronic devices. In addition to passive elements such as a resistive element or a capacitive element, active elements such as a field effect transistor (FET), represented by a MOS (Metal Oxide Semiconductor) transistor, or a bipolar transistor are integrated in the integrated circuit. In particular, bipolar transistors are used in various applications such as audio, various sensors, display drivers, and the like.

The significant electrical characteristics of bipolar transistors are, for example, the current amplification factor, early voltage, and the like. In general, from the perspective of the circuit characteristics, a high current amplification factor and a high Early voltage are desirable. Specifically, for example, in a current mirror circuit or the like, in a case where the current amplification factor is high and the Early voltage is high, it is possible to increase the accuracy of the current which is generated. Several methods for increasing the Early voltage or current amplification factor have been disclosed. For example, in Japanese Unexamined Patent Application Publication No. 06-310526, a bipolar transistor to improve the current amplification factor has been disclosed.

SUMMARY

In general, there is a correlation between the Early voltage and current amplification factor, and it is difficult to have both a high current amplification factor and a high Early voltage. That is, there is a tradeoff between the Early voltage and the current amplification factor. Therefore, a bipolar transistor that can realize both a high Early voltage and high current amplification factor is desired.

In recent years, for example, in a logic circuit or the like, a MOS transistor that can reduce power consumption while realizing a high level of integration is often used. At that time, depending on the application, there are cases where it is desirable to form the MOS transistor and the bipolar transistor on the same chip. In these cases, it is desired that the manufacturing process for the MOS transistor and a bipolar transistor be shared as far as possible, and manufacturing be performed with fewer steps. However, Japanese Unexamined Patent Application Publication No. 06-310526 does not disclose a case of forming the bipolar transistor on the same chip as the MOS transistor.

The present disclosure was made in view of such problems, and there is a need for providing a semiconductor device which is able to have both a high Early voltage and high current amplification factor, and further, manufacturing may be performed with fewer manufacturing steps, even in a case of manufacturing together with a CMOS transistor.

According to an embodiment of the present disclosure, there is provided a semiconductor device including a base, an emitter, a doped region, and a collector. The base is of a first conductivity type formed on the surface of the substrate. The emitter is of a second conductivity type formed on the surface of the base. The doped region is of the second conductivity type, is arranged to be spaced apart on the surface of the base from the emitter and, along with receiving a first type of carrier from the emitter, injects the first type of carrier into the base. The collector is of the second conductivity type and is formed on the opposite side to the emitter and doped region with the base interposed therebetween.

In the semiconductor device according to an embodiment of the present disclosure, the first type of carrier is injected into the base from the emitter, the carrier reaches the collector and becomes a collector current. At this time, the first type of carrier, along with being injected directly into the base from the emitter, is injected from the emitter into the base via the doped region.

According to the semiconductor device according to an embodiment of the present disclosure, since the doped region is provided from which the first type of carrier is injected into the base, while receiving the first type of carrier from the emitter, it is possible to have both high Early voltage and high current amplification factor. Further, even in a case of manufacturing with a CMOS transistor, manufacturing is able to be performed with fewer manufacturing process.

BRIEF DESCRIPTION OF THE DRAWINGS

FIG. 13 is a cross-sectional view showing a configuration example of a bipolar transistor according to a second embodiment.

DETAILED DESCRIPTION OF EMBODIMENTS

Hereinafter, an embodiment of the present disclosure will be described in detail with reference to the accompanying drawings. In addition, the explanation will be given in the following order.
1. First Embodiment
2. Second Embodiment
3. Third Embodiment

1. First Embodiment

Configuration Example

Overall Configuration Example

Figure 1:
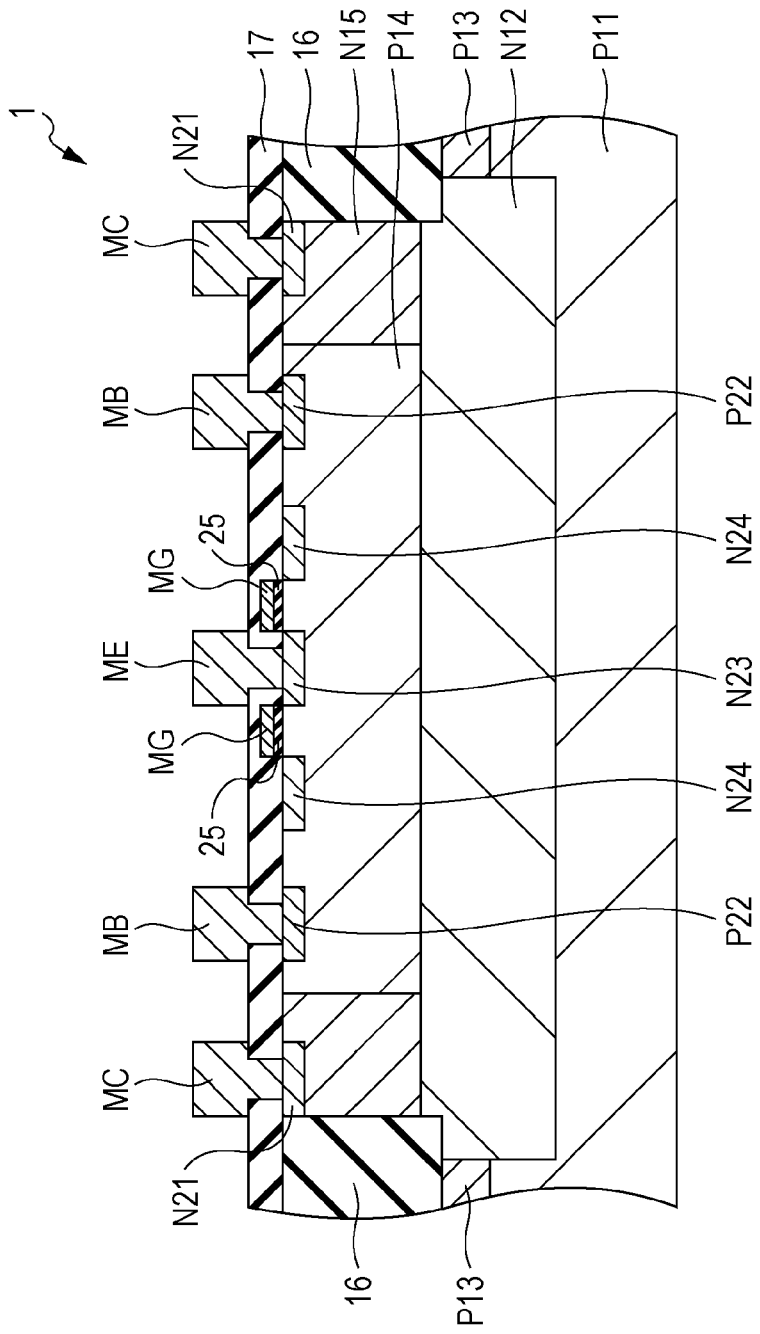
FIG. 1 is a cross-sectional view showing a configuration example of a bipolar transistor according to a first embodiment of the present disclosure.
Figure 2:
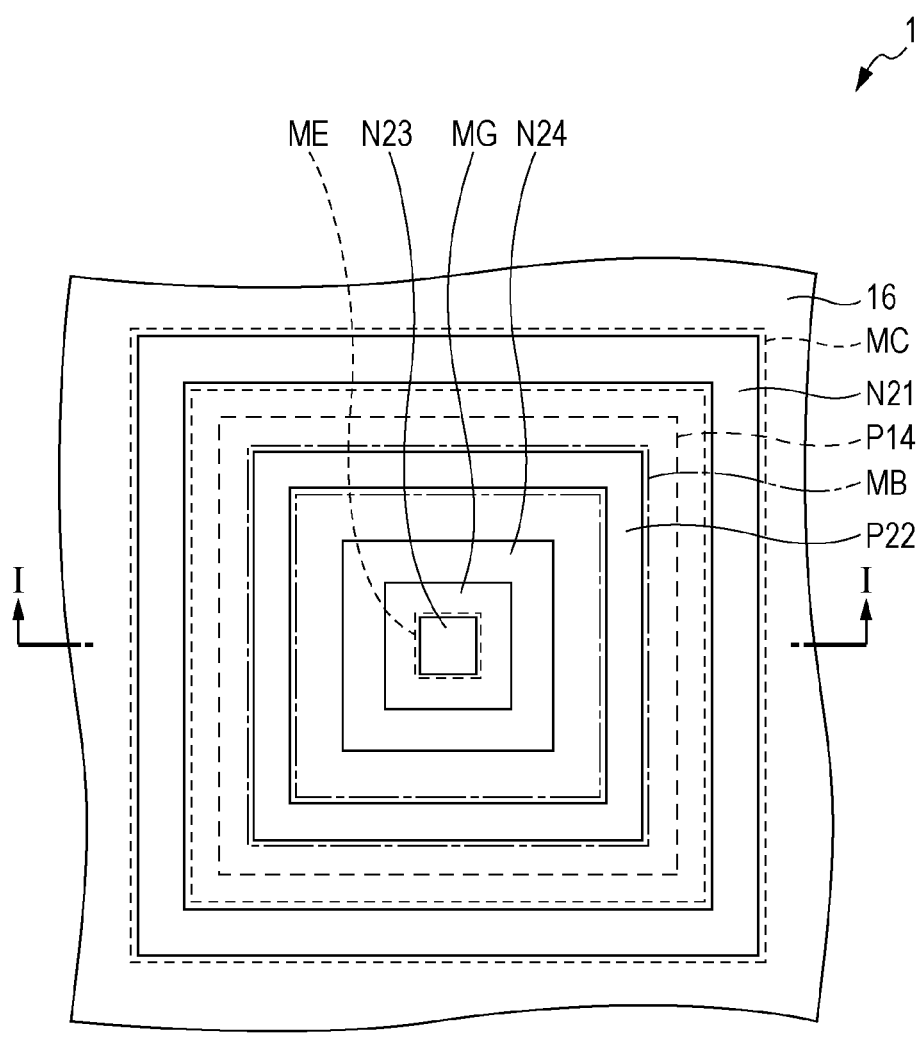
FIG. 2 is a plan view showing a configuration example of a bipolar transistor shown in FIG. 1.

FIGS. 1 and 2 show a configuration example of a bipolar transistor according to a first embodiment of the present disclosure. FIG. 1 shows a cross-sectional configuration; FIG. 2 shows a plan view showing a configuration. FIG. 1 shows a cross-sectional configuration taken along the line I-I in FIG. 2. A bipolar transistor 1 formed on the P-type substrate P11, and is a so-called vertical NPN transistor, which can be formed using the typical CMOS manufacturing process, without the addition of a dedicated process. As shown in FIGS. 1 and 2, on the surface of the substrate, along with forming an oxide film 16 in order to isolate the elements, a P well P13 is formed between the oxide film 16 and the P-type substrate P11 to similarly isolate the elements, and a bipolar transistor 1 is formed in the region surrounded by the oxide film 16 and P well P13.

A bipolar transistor 1 includes an N-well N12, a P-well P14, N+ sources N23 and N24, a gate electrode MG, and a gate oxide film 25.

The N-well N12 is an N type diffusion layer and, as shown in FIGS. 1 and 2, is formed on P-type substrate P11. This N-well N12, corresponds to the collector of the bipolar transistor 1. The N-well N15 and P-well P14 are each formed in different regions on the N-well N12. As shown in FIG. 2, the N-well N15 is formed so as to surround the P-well P14. The N-well N15 is an N-type diffusion layer, and is electrically connected to the N-well N12. On the surface of the N-well N15, an N+ source N21 is formed. The N-well N15 and N+ source N21 function as a collector extraction region which is to transfer a potential between the N-well N12 and the collector electrode MC to be described later.

The P-well P14 is a P-type diffusion layer, which corresponds to the base of the bipolar transistor 1. The P-well P14 is formed at the same time as and using the same process as the P-well P13. On surface of the P-well P14, as shown in FIG. 2, a P+ source P22 which is a P-type diffusion layer is formed in a ring-shape on the outside. This P+ source P22 functions as a base extraction region to transfer a potential between P-well P14 and a base electrode MB to be described later.

The N+ source N23 is formed on the surface of the P-well P14 in the vicinity of the center, and the N+ source N24 is formed spaced apart from the N+ source N23 so as to encircle the N+ source N23. N+ source N23 and N+ source N24 are N-type diffusion layers, and, in the present example, and are formed at the same time and using the same process as the N+ source N21. On P-well P14, the gate electrode MG and the gate oxide film 25 are formed in this order on the surface of the region between the N+ source N24 and N+ source N23. To the gate electrode MG, for example, a high voltage such as a power supply voltage is applied. The N+ source N23 functions as an emitter of the bipolar transistor 1. In addition, N+ source N24, as will be described later, functions as a second emitter. More specifically, as is explained later, the lower portion of gate oxide film 27 in the gate electrode MG, gate oxide film 25, and the P-well P14 configure the structure of an N-type MOS, and through fulfilling a role of allowing conduction between the N+ source N23 and the N+ source N24, electrons are supplied to the N+ source N24 from the N+ source N23. As a result, the N+ source N24 functions as the second emitter.

A field oxide film 17 is formed on the surface of the P-well P14, N-well N15, oxide film 16, and the like. This field oxide film 17 has openings in regions corresponding to the N+ source N21, P+ source P22 and N+ source N23, and the openings, as contact holes, respectively electrically connect the N+ source N21, P+ source P22, and N+ source N23 to the collector electrode MC, base electrode MB, and emitter electrode ME. That is, the region corresponding to the N+ source N24 of the field oxide film 17 does not have openings, such that the N+ source N24 is not directly connected to the electrode. In the emitter electrode ME, collector electrode MC and the base electrode MB, typically, a voltage is applied such that between the base and emitter becomes forward-biased, and between the base and collector becomes reverse-biased.

From the viewpoint of the manufacturing process, after the oxide film 16 is first formed on the P-type substrate P11, an N-well N12 is formed. Then, at the same time as P-wells P13 and P14 are formed, N-well N15 is formed. The gate electrode MG and the gate oxide film 25 are pattern formed on the P-well P14. Then, N+ sources N23, N24 and N21 are formed at the same time on the surface of the P-well P14 and N-well N15. In other words, the impurity profiles of N+ source N21, N23 and N24 are the same as each other. Similarly, P+ source P22 is formed on the surface of the P-well P14. Then, after the oxide film 16 is formed, the field oxide film 17 is formed on the surface of the P-well P14, N-well N15, oxide film 16, and the like. Then, contact holes are formed in the field oxide film 17, and the emitter electrode ME, collector electrode MC and the base electrode MB are formed.

The bipolar transistor 1 can be formed using the typical CMOS manufacturing process, without addition of a dedicated process. Next, a description will be given of a MOS transistor formed on the same chip as bipolar transistor 1.

Figure 3:
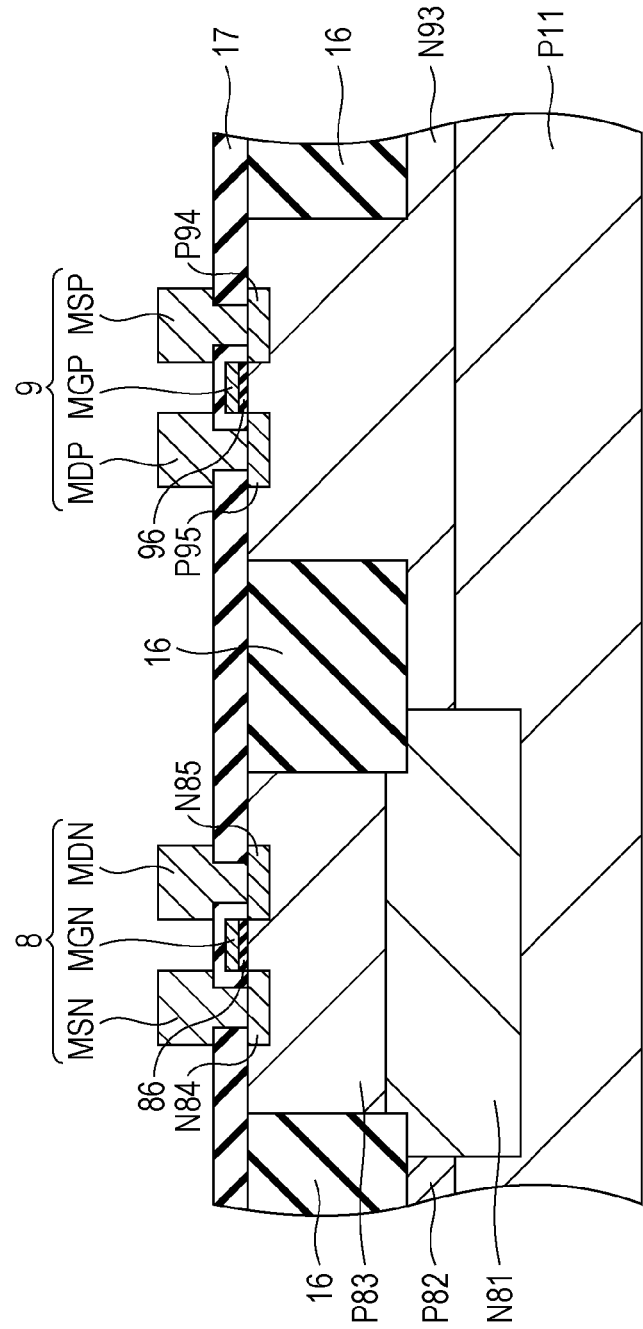
FIG. 3 is a cross-sectional view showing a configuration example of a MOS transistor.

FIG. 3 shows a configuration example of the MOS transistor. In FIG. 3, an NMOS transistor 8 is shown on the left side, and a PMOS transistor 9 is shown on the right side. The back-gate of the NMOS transistor 8 is, in the present example, electrically isolated from the P-type substrate P11. In addition, in FIG. 3, for example, electrodes for applying a voltage to the back-gate are not shown.

In the NMOS transistor 8, an N-well N81 is formed on the P-type substrate P11, and thereon a P-well P83, which functions as the back-gate of the NMOS transistor 8, is formed. N-well N81 has the function of electrically isolating the P-well P83 and the P-type substrate P11. On the surface of the P-well P83, the N+ source N85 and the N+ source N84, which function as the source and drain of the NMOS transistor 8, are formed to be spaced apart from each other. In the P-well P83, gate oxide film 86 and gate electrode MGN are formed in this order on the surface of the region between the N+ source N85 and N+ source N84. Further, on the N+ source N85 and N+ source N84, a source electrode MSN and a drain electrode MDN are each formed via the contact holes of the field oxide film 17.

In PMOS transistor 9, N-well N93 is formed on the P-type substrate P11. On the surface of the N-well N93, P+ source P94 and P+ source P95, which function as the source and drain of the PMOS transistor 9, are formed spaced apart from each other. In the N-well N93, On the surface of the area between the P+ source P95 and P+ source P94, the gate oxide film 96 and the gate electrode MGP are formed in this order. Further, source electrode MSP and a drain electrode MDP are each formed on the P+ source P94 and P+ source P95 via the contact holes of the field oxide film 17.

The bipolar transistor 1 shown in FIGS. 1 and 2 can be formed by the same manufacturing process as the PMOS transistor 9 and NMOS transistor 8 shown in FIG. 3. More specifically, the N-well N12 of bipolar transistor 1 (FIG. 1) is formed with the same process as the n-well N81 of the NMOS transistor 8 (FIG. 3). The P-well P14 of the bipolar transistor 1 (FIG. 1) is formed by the same process as P-well P83 which functions as the back-gate of the NMOS transistor 8 (FIG. 3). The N-well N15 of bipolar transistor 1 (FIG. 1) is formed by the same process as the N-well N93 which functions as the back-gate of the PMOS transistor 9 (FIG. 3). The gate electrode MG and the gate oxide film 23 of the bipolar transistor 1 (FIG. 1) are formed by the same process as the gate oxide film 86 and gate electrode MGN of the NMOS transistor 8, and gate oxide film 96 and gate electrode MGP of the PMOS transistor 9 (FIG. 3). The N+ sources N21, N23, N24 of the bipolar transistor 1 (FIG. 1) are formed by the same process as the N+ sources N84 and N85 which function as the source and drain of the NMOS transistor 8 (FIG. 3). Further, the P+ source P22 of the bipolar transistor 1 (FIG. 1) is formed by the same process as the P+ sources P94, P95, which function as the source and drain of the PMOS transistor 9 (FIG. 3).

Here, the N+ source N23 corresponds to a specific example of an "emitter" in an embodiment of the present disclosure. The N+ source N24 corresponds to a specific example of a "doped region" in an embodiment of the present disclosure. The P-well P14 corresponds to a specific example of a "base" in an embodiment of the present disclosure. The N-well N12 corresponds to a specific example of a "collector" in an embodiment of the present disclosure. The gate oxide film 25 corresponds to a specific example of an "insulating film" in an embodiment of the present disclosure.

[Operations and Actions]

Subsequently, the operations and actions of the bipolar transistor 1 of the present embodiment of the disclosure will be explained.

(Basic Operations)

Figure 4:
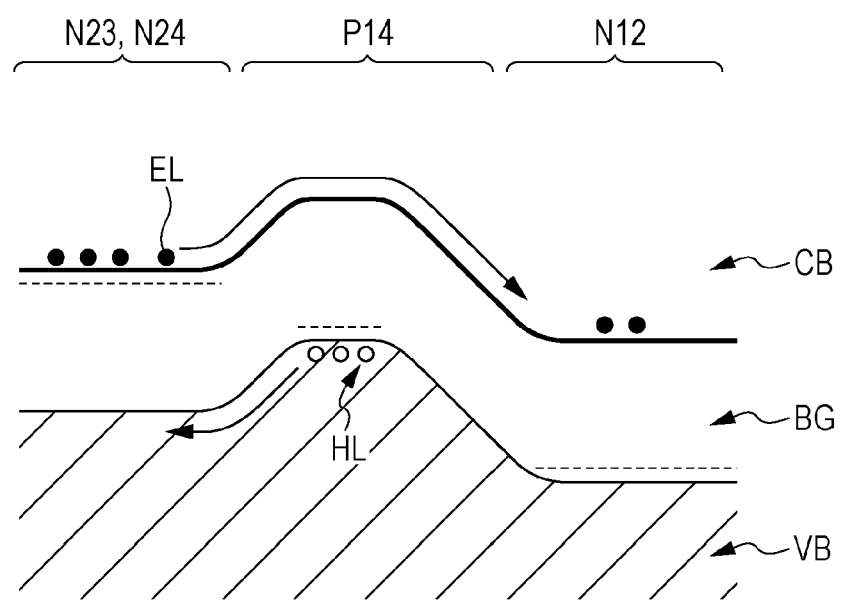
FIG. 4 is an explanatory diagram showing an example of an energy band diagram of the bipolar transistor shown in FIG. 1.

FIG. 4 shows an energy band diagram of a bipolar transistor 1. The bipolar transistor 1, along with electrons EL moving in the conduction band CB, positive holes HL move in the valence band VB. In the present example, a voltage which becomes forward biased between the base and emitter and becomes reverse biased between the base and collector is applied to the collector electrode MC, base electrode MB and the emitter electrode ME.

First, the basic operation of a bipolar transistor 1 will be described with reference to FIGS. 1, 2, and 4. First, the N+ source N23 (emitter) and the like emit electrons EL which are the majority carrier, and these electrons EL are injected into the P-well P14 (base). The electrons EL which are injected into the P-well P14 (base) diffuse in the P-well P14. At this time, in the P-well P14 (base), a portion of the electrons EL recombine with the positive holes HL which are the majority carriers of the P-well P14. Then, through this recombination and the injection of positive holes HL into the emitter from the base, a base current Ib occurs. On the other hand, most electrons EL diffuse in the P-well P14 (base), reach the junction region of the base and collector, that is, the vicinity of the boundary of the P-well P14 (base) and N-well N12 (collector), and flow to the N-well N12 (collector) side due to the reverse bias between the base and collector. In this way, due to the electrons EL which are injected into the P-well P14 (base) from the N+ source N23 (emitter), or the like moving to the N-well N12 (collector), a collector current Ic flows from the collector to the emitter. The relationship between the base current Ib and the collector current Ic is as follows.

$$hFE = Ic/Ib \quad (1)$$

Here, hFE is the current amplification factor. In this way, in the bipolar transistor 1, the collector current Ic, which is the base current Ib amplified by the current amplification factor hFE, becomes able to flow.

(Detailed Operation)

In the bipolar transistor 1, on the surface of the P-well P14 (base), the N+ source N24 is formed spaced apart from the N+ source N23 so as to encircle the N+ source N23 (emitter). Thus, the N+ source N24 functions as a second emitter. Below, a detailed explanation will be given.

Figure 5A:
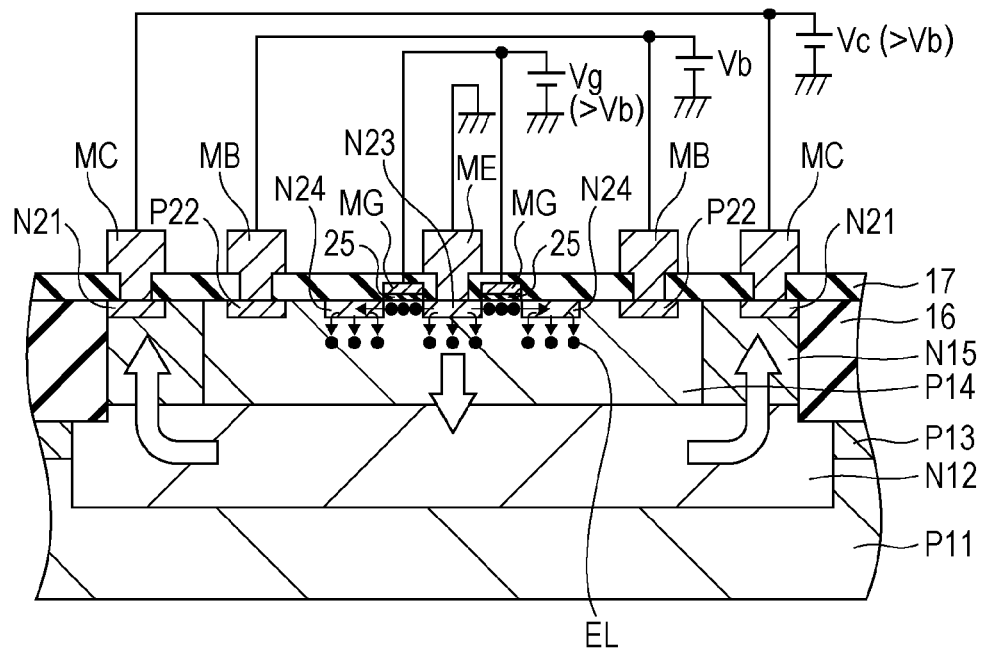
FIGS. 5A and 5B are other explanatory diagrams showing an operation example of a bipolar transistor shown in FIG. 1.
Figure 5B:
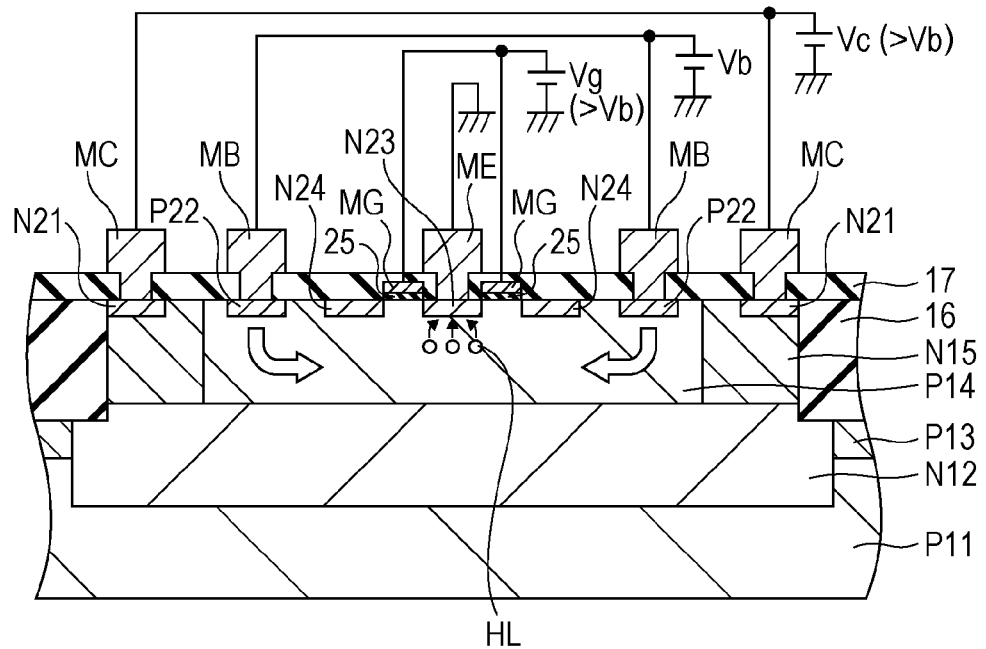

FIGS. 5A and 5B schematically show the detailed operation of the bipolar transistor 1; FIG. 5A shows the movement of electrons, and FIG. 5B shows the movement of the positive holes. In the present example, as shown in FIGS. 5A and 5B, along with the emitter electrode ME being grounded, a voltage Vb is applied to the base electrode MB and, in so doing between the base and emitter enters a forward biased state. In addition, in the collector electrode MC, a voltage Vc greater than the voltage Vb is applied and, in so doing, between the base and collector enters a reverse biased state. In addition, in the gate electrode MG, a voltage Vg greater than the voltage Vb is applied.

First, the movement of electrons will be explained. In a bipolar transistor 1, as shown in FIG. 5A, the N+ source N23 (emitter) emits electrons EL which are majority carriers, and these electrons EL are injected into P-well P14 (base). At the same time, a channel is formed in a region just below the gate electrode MG and the gate oxide film 25 in the P-well P14, and the N+ source N23 supplies the electrons EL with respect to the N+ source N24 via this channel. That is, the lower portion of the gate oxide film 25 in the gate electrode MG, gate oxide film 25, and the P-well P14, configures an N-type MOS structure and through a voltage Vg being applied to the gate electrode MG, the channel is formed.

Figure 6:
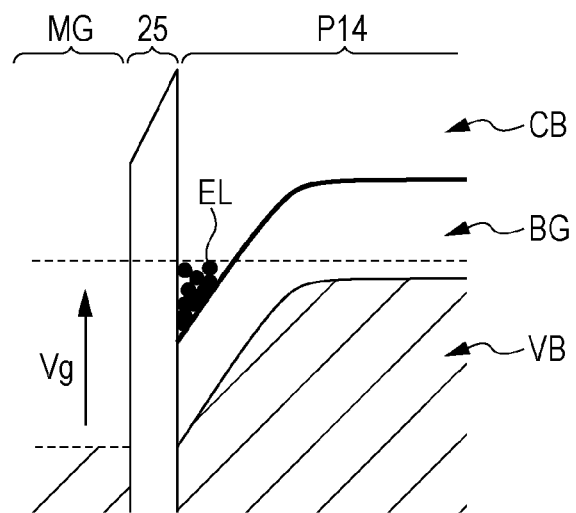
FIG. 6 is an explanatory diagram showing an example of an energy band diagram of a MOS structure in the bipolar transistor shown in FIG. 1.

FIG. 6 shows an energy band diagram of a MOS structure. By applying a voltage Vg to the gate electrode MG, in the vicinity of the gate oxide film 25 in P-well P14, the band curves, and in the conduction band CB, electrons EL gather in the vicinity of the interface. That is, in the vicinity of the gate oxide film 25 in the P-well P14, by applying a sufficiently high voltage Vg to the gate electrode MG, a strong inversion state is created and a channel is formed in order to transport electrons EL. Then, the electrons EL transfer through in the vicinity of the interface with the P-well P14 in which the channel is formed, and are able to move between the N+ source N23 and the N+ source N24. Moreover, because this channel is formed in the vicinity of the interface, there is no movement of electrons EL toward the inside of the P-well P14 from the channel.

In this way, the N+ source N23 (emitter) supplies the electrons EL with respect to the N+ source N24 via the channel. At this time, because the N+ source N24 and N+ source N23 are conductive by forming the channel and have substantially the same potential, similarly to between the P-well P14 (base) and N+ source N25 (emitter) being in a forward biased state, between the P-well P14 (base) and N+ source N24 also enters a state of forward bias. Thus, in a bipolar transistor 1, as shown in FIG. 5A, not only N+ source N23 (emitter), but also the N+ source N24 emit electrons E1, and these electrons EL are injected into the P-well P14 (base). In other words, N+ source N24 functions as a second emitter.

In other words, in the bipolar transistor 1, electrons EL are injected into the P-well P14 (base) by the two paths. That is, the first path is a path in which the electrons EL are directly injected from the N+ source N23 (emitter) to the P-well P14 (base). And the second path is a path in which electrons EL are supplied to the N+ source N24 (second emitter) via a channel from the N+ source N23 (emitter), and subsequently are injected into the P-well P14 (base) from N+ source N24.

Most of the electrons EL injected into the P-well P14 (base) diffuse in the P-well P14, and after reaching the vicinity of the boundary between the N-well N12 (collector) and P-well P14 (base), flow to the N-well N12 (collector) side due to the reverse bias between the base and collector. In this way, collector current Ic occurs.

In this way, in a bipolar transistor 1, along with providing an N+ source N24 in addition to the N+ source N23, an N-type MOS structure is provided between the N+ sources N23 and N24, and since a channel is formed causing the N+ sources N23 and N24 to be conductive, not only the N+ source N23 (emitter), but also the N+ source N24 can emit electrons EL, and the collector current Ic is able to increase.

Next, the movement of positive holes will be described. In the process of diffusion in the P-well P14, a portion of the electrons EL injected into P-well P14 (base) from the N+ sources N23 and N24 recombine with the positive holes HL which are majority carriers of the P-well P14. In addition, the positive holes HL are injected into the N+ source N23 (emitter) from the P-well P14 (base). Through this recombination and the injection of positive holes HL into the emitter from the base, the base current Ib occurs.

In other words, there is no flow of the positive holes HL from the P-well P14 (base) to the N+ source N24. The reason for this is that the MOS structure between the N+ source N24 (second emitter) and N+ source N23 (emitter) is an N-type MOS structure, and as shown in FIG. 6, the channel formed by strong inversion (N channel) is able to transfer electrons EL, but is unable to transfer positive holes HL. In this way, since movement of the positive holes HL is blocked between the N+ source N24 (second emitter) and N+ source N23 (emitter), the positive holes HL flow from the P-well P14 (base) directly to N+ source N23 without being able to flow via the N+ source N24 from the P-well P14 (base) to N+ source N23.

In this way, in the bipolar transistor 1, an N-type MOS structure is provided between the N+ source N24 and the N+ source N23, since a channel is formed which transfers the electrons EL, it is possible to reduce the base current Ib in order for the channel to block the movement of the positive holes HL.

As described above, in the bipolar transistor 1, while it is possible to increase the collector current Ic, the base current Ib can be suppressed to be low. As a result, as is clear from expression (1), it is possible to increase the current amplification factor hFE.

In particular, in the bipolar transistor 1, along with forming the N+ source N23 to be small in the vicinity of the center of the surface of the P-well P14, since the N+ source N24 is formed so as to encircle the N+ source N23, the current amplification factor hFE is able to be effectively increased. In other words, by in the bipolar transistor 1, through forming in this way, the area of the junction of the P-well P14 (base) and N+ source N24 (second emitter) is able to be made larger than the area of the junction of the P-well P14 (base) and N+ source N23 (emitter). In so doing, in order for the area of the junction of the P-well P14 (base) and N+ source N24 (second emitter) to be large, numerous electrons EL are able to be injected into the P-well P14 from N+ source N24, and the electrons EL are able to increase the collector current Ic. On the other hand, since the area of the junction of the P-well P14 (base) and N+ source N23 (emitter) is small, it is possible to reduce the number of positive holes HL flowing into the N+ source N23 from P-well P14 (base). In this way, in the bipolar transistor 1, the collector current Ic is able to increase, while on the other hand the base current Ib is able to be suppressed to be small, and the current amplification factor hFE is able to be increased.

Next, the Early effect, which is one of the significant characteristics of a bipolar transistor, will be described. In a bipolar transistor, when controlling the collector current Ic through the base current Ib, it is desirable that the collector current Ic not vary due to the voltage Vce between the collector and emitter. However, in practice, if the voltage Vce increases, the collector current Ic varies due to the Early effect. More specifically, for example, in FIG. 1, when the voltage Vce between the N+ source N23 (emitter) and N-well N12 (collector) is increased, a large reverse bias is applied between the N-well N12 (collector) and the P-well P14 (base). At this time, in this junction region, the depletion layer spreads over on the P-well P14 side. Thus, a so-called base width modulation effect occurs and the effective base width becomes narrower, and as a result, the collector current Ic is increased.

The Early voltage is often used as an indication of the Early effect. Next, the Early voltage will be explained.

Figure 7:
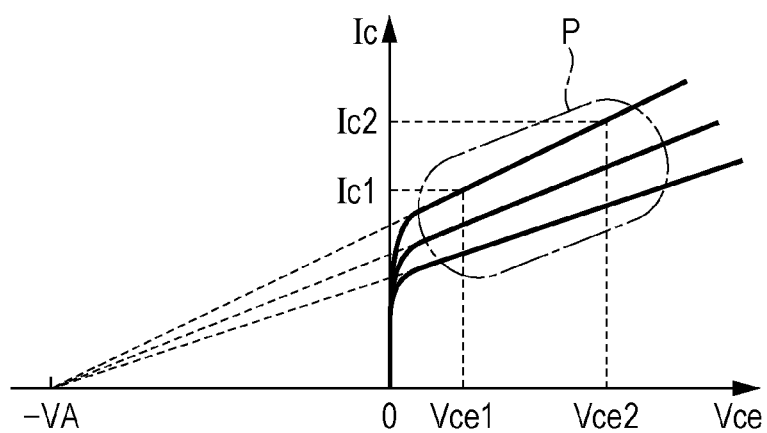
FIG. 7 is an explanatory diagram for explaining the Early voltage.

FIG. 7 shows the static characteristics of the bipolar transistor. FIG. 7 shows, in some examples of the base current Ib, the relationship between the collector current Ic and the voltage Vce between the collector and emitter. In a bipolar transistor, when voltage Vce a predetermined voltage or more, the collector current Ic increases slowly as the voltage Vce increase (Portion P). The characteristics of this portion are extrapolated in the direction of voltage Vce lowering, and the voltage Vce where the extrapolated line intersects the collector current Ic line=0 (horizontal axis) is (−VA). Here, VA is the Early voltage. The Early voltage VA can be expressed by the following expression:

$$VA = -(Vce1 \times Ic2 - Vce2 \times Ic1)/(Ic2 - Ic1) \quad (2)$$

Here, as shown in FIG. 7, for a given base current, Ic1 is the collector current when the voltage between the collector and emitter is voltage Vce1, and for the same base current, Ic2 is the collector current when the voltage between the collector and emitter is voltage Vce2. The higher this Early voltage VA is, the more preferable. That is, as shown in FIG. 7, the higher the Early voltage VA, the lower the slope of the portion P, making it difficult to vary the collector current Ic through the voltage Vce.

In general, there is a correlation between the current amplification factor hFE and the Early voltage VA. More specifically, for example, in order to increase the Early voltage VA, for example, if spreading of the depletion layer to the base side is prevented by changing the impurity profile, the base width widens. In so doing, recombination of the electrons EL and the positive holes HL in the base is apt to occur, and in order for as the base current Ib to increase, current amplification factor hFE deteriorates.

In the bipolar transistor 1, through using this relationship, it is possible to have both a high Early voltage VA and high current amplification factor hFE. That is, it is possible to use a part of the high current amplification factor hFE obtained through the configuration such as shown in FIG. 1 to increase the Early voltage VA. More specifically, for example, by changing the impurity profile in the P-well P14 (base), it is possible to increase the Early voltage VA while reducing the current amplification factor hFE slightly.

In other words, a bipolar transistor 1 according to an embodiment of the present disclosure can increase the product of the current amplification factor hFE and the Early voltage VA. That is, in general, in the current amplification factor hFE and Early voltage VA, because of the correlation described above, even if impurity profile changes or the like, for example, it is difficult to increase the hFE·VA product, which is the product thereof. On the other hand, in the bipolar transistor 1, by having such a configuration as shown in FIG. 1, it is possible to increase the current amplification factor hFE while maintaining the Early voltage VA as is. Then, the increased current amplification factor hFE is able to be used to increase the Early voltage VA. In this way, in the bipolar transistor 1, it is possible to increase the hFE·VA product itself.

Further, in bipolar transistor 1, as in the present example, this is particularly effective in the case of forming a MOS transistor and bipolar transistor on the same chip (for example, NMOS transistor 8 and PMOS transistor 9) using the typical CMOS manufacturing process. In other words, in such a case, in order to prevent the MOS transistor from malfunctioning due to the parasitic bipolar effect or the like, the impurity profile is frequently adjusted. Because the processing conditions in this case are not necessarily the optimal conditions for a bipolar transistor, for example, there are cases where the product of hFE and VA is unable to increase. Even in such cases, the bipolar transistor 1 is, through the configuration such as shown in FIG. 1, able to increase the hFE·VA product while suppressing the effects of MOS transistor.

Comparative Example

Next, along with describing the bipolar transistor 1R according to the present comparative example, the effects of the present embodiment will be described in comparison with the present comparative example. The bipolar transistor 1R is a common vertical NPN transistor.

Figure 8:
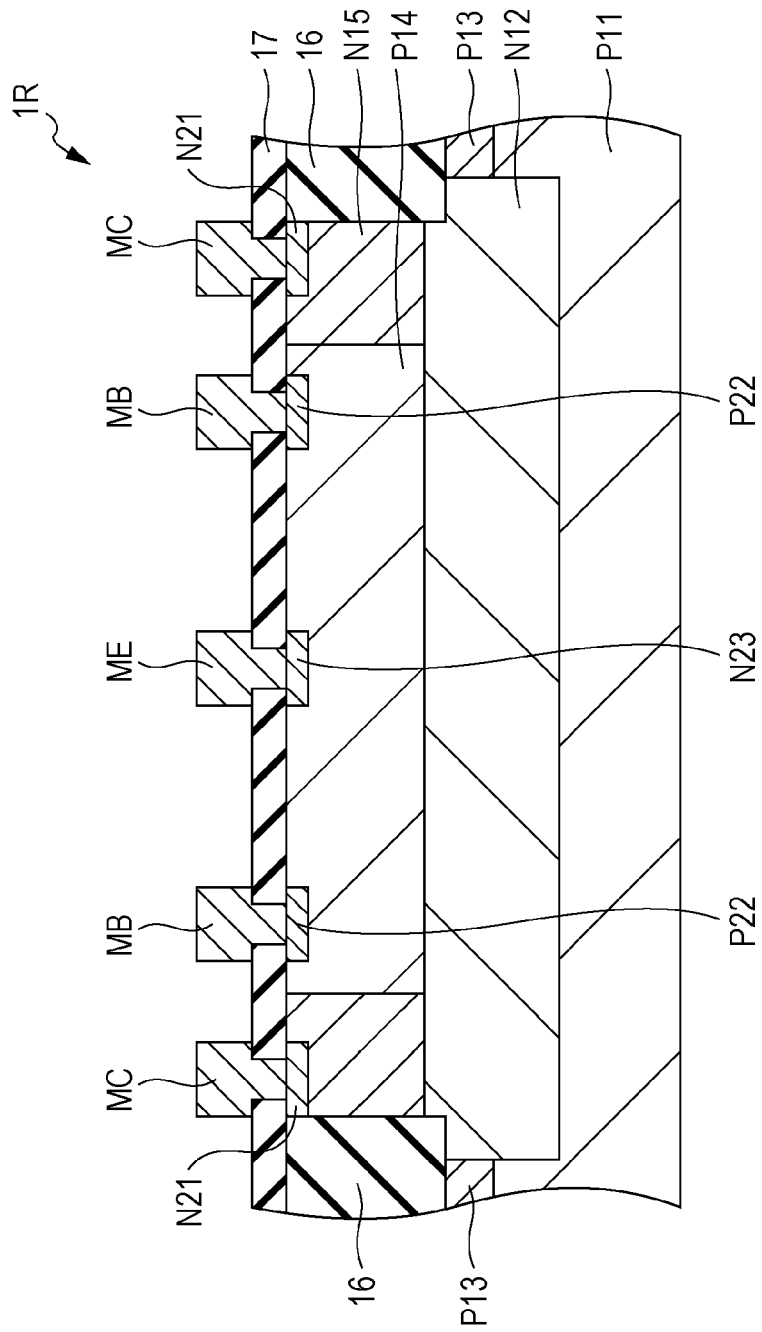
FIG. 8 is a cross-sectional view showing a configuration example of a bipolar transistor according to a comparative example.

FIG. 8 shows a cross-sectional configuration of a bipolar transistor 1R according to the present comparative example. The bipolar transistor 1R omits the N+ source N24, gate electrode MG, and gate oxide film 25 from the bipolar transistor 1 according to the present embodiment (FIG. 1).

Figure 9A:
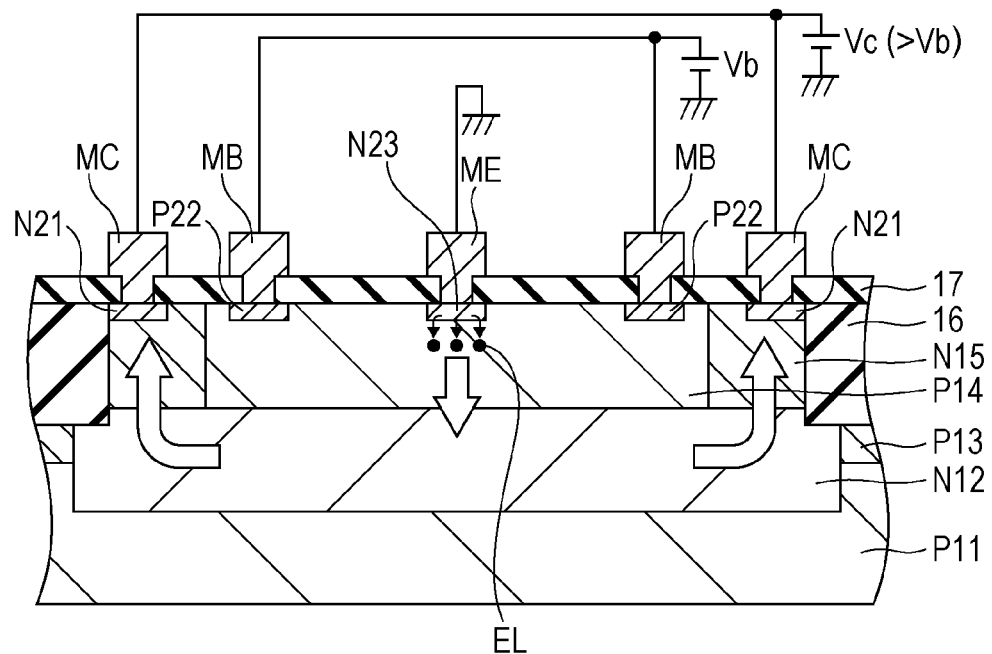
FIGS. 9A and 9B are explanatory diagrams showing an operation example of a bipolar transistor shown in FIG. 8.
Figure 9B:
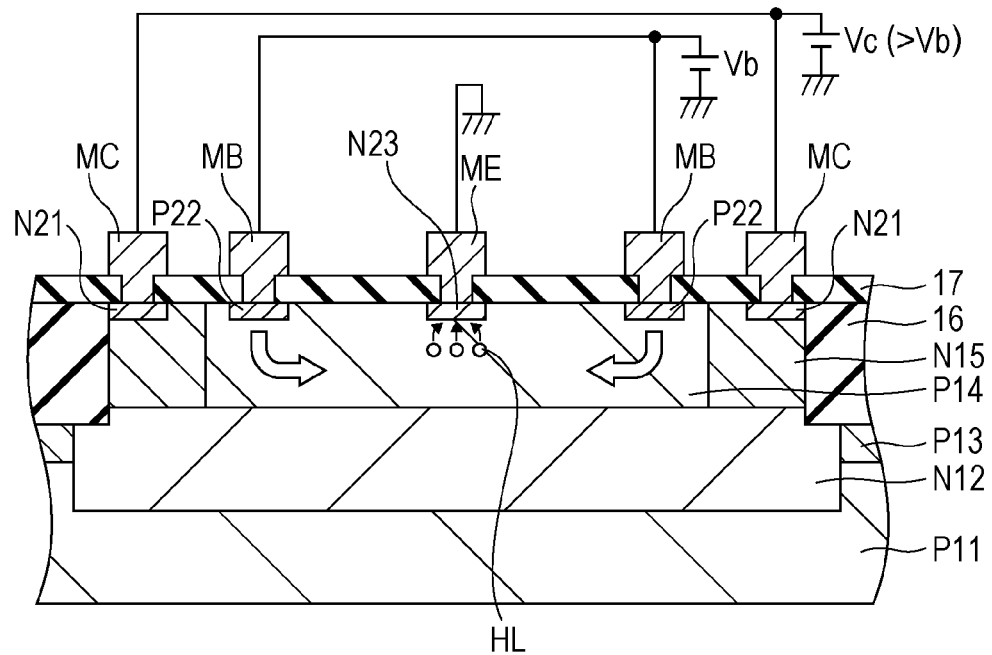

FIGS. 9A and 9B schematically show the detailed operation of the bipolar transistor 1R. FIG. 9A shows the movement of electrons; FIG. 9B shows the movement of positive holes. The respective bias conditions of the collector, base and emitter are the same as the case of a bipolar transistor 1 according to the present embodiment (FIG. 4).

In the bipolar transistor 1R according to the present comparative example, as shown in FIG. 9A, the N+ source N23 (emitter) emits electrons which are majority carriers, and these electrons are injected into the P-well P14 (base). Most of the electrons injected into the P-well P14 (base) diffuse in the P-well P14, and after reaching the vicinity of the boundary between the P-well P14 (base) and N-well N12 (collector), move to the N-well N12 (collector) side due to the reverse bias between the base and collector. In this way, the collector current Ic is occurs. At this time, in order that the electrons EL be emitted from the N+ source N23 only, the collector current Ic becomes small in accordance thereto.

On the other hand, in the bipolar transistor 1 according to the present embodiment, along with being provided with an N+ source N24 in addition to the N+ source N23, an N-type MOS structure is provided between the N+ sources N23 and N24, and a channel transferring electrons EL between N+ sources N23 and N24 is formed. In so doing, as shown in FIG. 5A, through further releasing the electrons EL not only from the N+ source N23 (emitter) but also the N+ source N24 (second emitter), while increasing the collector current Ic, as shown in FIG. 5B, the base current Ib can be suppressed to be low through the positive holes HL flowing from the P-well P14 to the N+ source N23 only. In this way, in bipolar transistor 1, it is possible to increase the current amplification factor hFE, and to increase the hFE·VA product itself.

Figure 10:
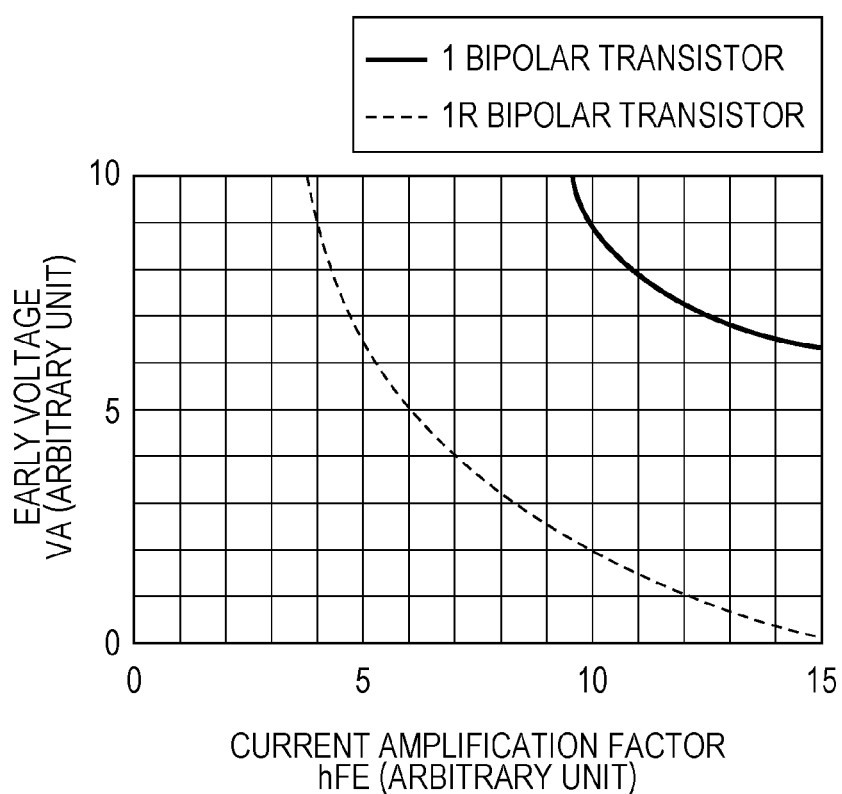
FIG. 10 is a characteristic diagram showing a characteristic example of a bipolar transistor shown in FIG. 1.

FIG. 10 shows a characteristic example of the Early voltage VA and current amplification factor hFE. In FIG. 10, the characteristics shown by the solid line are the characteristic example of a bipolar transistor 1 according to the present embodiment, and the characteristics shown by the dashed line are a characteristic example of the bipolar transistor 1R according to the present comparative example. In the present example, the product of hFE·VA in the bipolar transistor 1 according to the present embodiment is compared to the product of hFE·VA of the bipolar transistor 1R according to the present comparative example, and is able to be increased by about three times.

In this way, in the bipolar transistor 1, through a configuration such as shown in FIG. 1, it is possible to increase the current amplification factor hFE, and to increase the hFE·VA product itself. In so doing, it is possible to increase the degree of freedom in the characteristic distribution between the Early voltage VA and the current amplification factor hFE.

[Effect]

In the present embodiment described above, since the N+ source N24 is provided, through the N+ source N24 functioning as a second emitter, the collector current Ic is able to be increased, and the current amplification factor is able to be increased.

Further, in the present embodiment, since an N-type MOS structure is provided between the N+ source N23 and the N+ source N24, along with effectively transferring electrons, the positive holes are able to be blocked, the current amplification factor is able to be increased.

Further, in the present embodiment, since the N+ source N24 is formed so as to encircle the N+ source N23, the current amplification factor is able to be effectively increased.

Further, in the present embodiment, since the current amplification factor is increased through such a configuration, the Early voltage and current amplification factor product itself is able to be increased, both a high Early voltage and a high current amplification factor are able to be achieved.

Further, in the present embodiment, rather than a change in the impurity profile, since the product itself of the Early voltage and current amplification factor is increased through such a configuration, even in a case of forming a bipolar transistor and a MOS transistor on the same chip, the Early voltage and current amplification factor product itself is able to be increased while suppressing the influence of the manufacturing process of the MOS transistor.

Modification Example 1-1

In the above-described embodiment, the N+ source N24 which functions as a second emitter is provided, but the embodiment is not limited thereto, and another N+ source may be provided so as to encircle the N+ source N24. Below, an example thereof will be described in detail.

Figure 11:
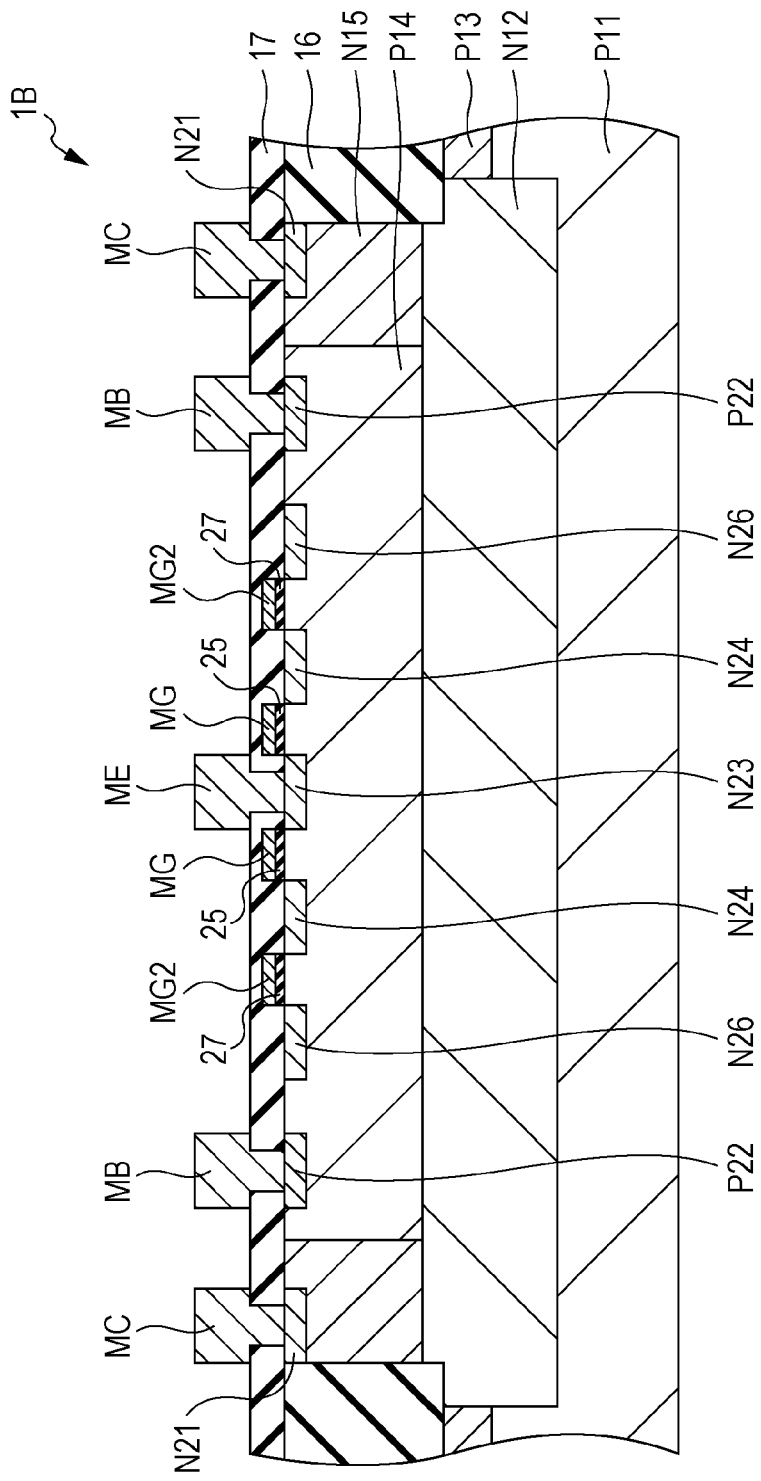
FIG. 11 is a cross-sectional view showing a configuration example of a bipolar transistor according to a modification example of the first embodiment.
Figure 12:
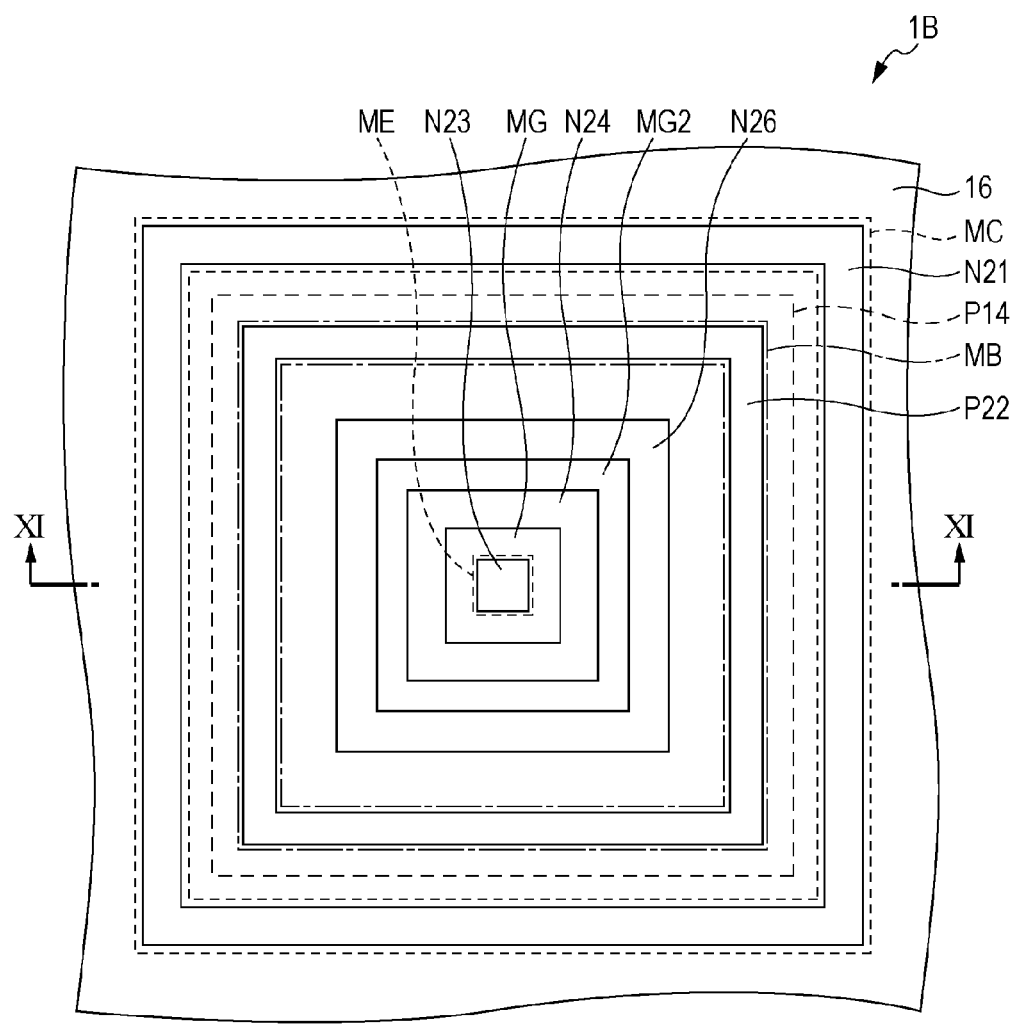
FIG. 12 is a plan view showing a configuration example of a bipolar transistor shown in FIG. 11.

FIGS. 11 and 12 show an example of the configuration of a bipolar transistor 1B according to the present modification example. FIG. 11 shows a cross-sectional configuration; FIG.

12 shows a planar configuration. FIG. 11 is a cross-sectional view showing a configuration seen from the line XI-XI in FIG. 12. The bipolar transistor 1B includes an N+ source N26 that is an N-type diffusion layer. On the surface of the P-well P14, further to the outside of the N+ source N24 that encircles the N+ source N23, the N+ source N26 is formed spaced apart so as to encircle the N+ source N24. This N+ source N26 is formed at the same time as and using the same process as the N+ sources N21, N23, and N24. In the P-well P14, On the surface of the region between the N+ source N26 and the N+ source N24, the gate oxide film 27 and the gate electrode MG2 are formed in this order. Although not shown, the gate electrode MG2 is connected to the gate electrode MG and, for example, a high voltage, such as a power supply voltage, is applied. This N+ source N26 functions as a third emitter. More specifically, the lower portion of gate oxide film 27 in the gate electrode MG2, gate oxide film 27, and the P-well P14 configure the structure of an N-type MOS, and through fulfilling a role of allowing conduction between the N+ source N24 and the N+ source N26, electrons are supplied to the N+ source N26 from the N+ source N24. As a result, the N+ source N26 functions as the third emitter.

Through this configuration, electrons EL are injected into P-well P14 (base) through three paths. In other words, similarly to the bipolar transistor 1R of the related art, the first path is a path in which electrons EL are directly injected into the P-well P14 (base) from N+ source N23 (emitter). Similarly to the bipolar transistor 1 according to the first embodiment, the second path is a path in which electrons EL are supplied to the N+ source N24 (second emitter) via a channel from the N+ source N23 (emitter), and thereafter are injected into the P-well P14 (base) from the N+ source N24. Further, the third path is a path in which electrons EL are supplied to the N+ source N26 (third emitter) via the channel from N+ source N24 (second emitter), and thereafter are injected into the P-well P14 (base) from N+ source N26.

On the other hand, between the N+ source N24 (second emitter) and N+ source N23 (emitter), and between the N+ source N26 (third emitter) and N+ source N24 (second emitter), in order for movement of the positive holes HL to be blocked, the positive holes HL flow from the P-well P14 (base) directly to the N+ source N23 without being able to flow to the N+ source N23 from the P-well P14 (base) via the N+ source N24 and further, without being able to flow to the N+ source N23 from the P-well P14 (base) via the N+ source N24 and the N+ source N26.

Thus, in the bipolar transistor 1B, through not only the N+ source N23 (emitter), but also the N+ source N26 (third emitter) and the N+ source N24 (second emitter) releasing electrons EL, the base current Ib is able to be suppressed to be low while increasing the collector current Ic through positive holes HL flowing from the P-well P14 to N+ source N23 only. In this way, in the bipolar transistor 1B, the current amplification factor hFE is able to be increased, and to increase the hFE·VA product itself.

Incidentally, in this example, only one N+ source is provided so as to encircle the N+ source N24, however, the embodiment is not limited thereto, and a plurality of N+ sources may be provided so as to encircle the N+ source N24.

Modification Example 1-2

In the above-described embodiment, although the bipolar transistor 1 is an NPN transistor, the transistor is not limited thereto, and instead, may be a PNP transistor, for example.

Modification Example 1-3

In the above-described embodiment, using a typical CMOS manufacturing process, a bipolar transistor 1 was formed without the addition of dedicated processes, however, the process is not limited thereto. For example, a dedicated process may be added to the typical CMOS manufacturing process, and the N+ source N24 and N+ source N23 may be formed by different processes according to different impurity profiles, or may be changed to a more optimal impurity profile in the base and collector, for example. In addition, rather than being limited to forming along with a MOS transistor, for example, an embodiment of the present disclosure may be applied to a bipolar transistor which is formed using bipolar manufacturing process which is optimized for bipolar transistor manufacturing.

2. Second Embodiment

Next, a description will be given of a bipolar transistor 2 according to the second embodiment. In the present embodiment, a second emitter is configured without using a MOS Structure. Those components that are substantially the same as in the bipolar transistor 1 according to the first embodiment are given the same reference numerals, and explanations thereof are omitted as appropriate.

FIG. 13 is a diagram showing an example of a cross-sectional configuration of a bipolar transistor 2 according to the present embodiment. The bipolar transistor 2 is provided with an N+ source N31 that is an N-type diffusion layer. N+ source N31, in the surface of the P-well P14, is formed spaced apart so as to encircle the N+ source N23. The N+ source N31 is formed at the same time and with the same process as N+ sources N21 and N23. The distance between the N+ source N31 and N+ source N23, in other words, the width of the portion interposed between the N+ source N23 and N+ source N31 of the P-well P14, as will be described later, is shorter than the diffusion length in the P-well P14 of electrons that are injected into the P-well P14 from the N+ source N23. Thereby, the N+ source N31, as will be described later, functions as a second emitter. In other words, in a bipolar transistor 1 according to the first embodiment, a MOS structure is provided, and through forming a channel between the N+ source N23 and the N+ source N24, the N+ source N24 was set to function as a second emitter; however, in the bipolar transistor 2 according to the present embodiment of the present disclosure, by the interval between the N+ source N31 and the N+ source N23 being shorter than the electron diffusion length, the N+ source N31 is set to function as a second emitter.

Further, similarly to the bipolar transistor 1 according to the first embodiment, a field oxide film 17 is formed on the N+ source N31 (second emitter), and the N+ source N31 is not directly connected to the electrode.

Figure 14A:
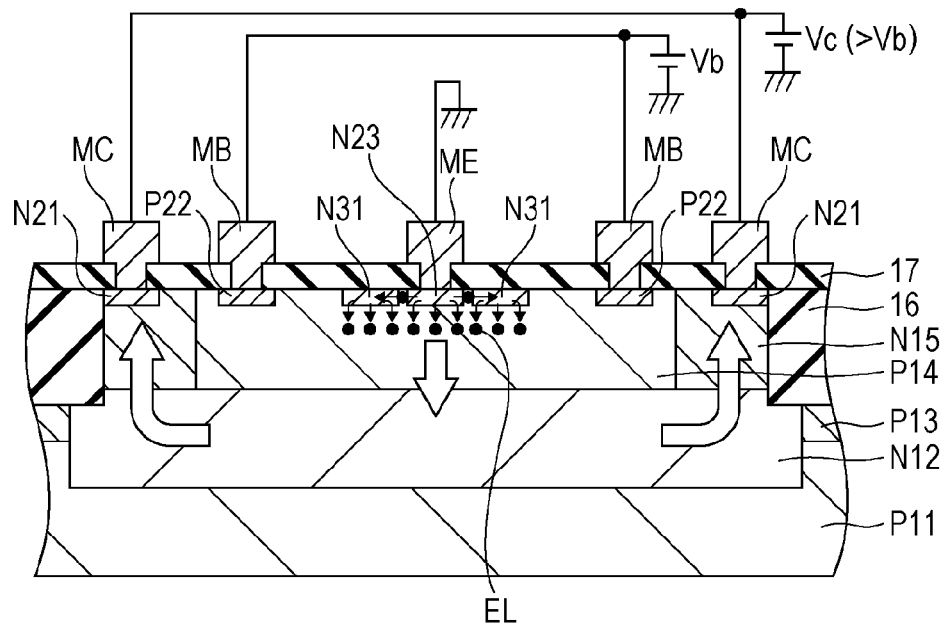
FIGS. 14A and 14B are explanatory diagrams showing an operation example of a bipolar transistor shown in FIG. 13.
Figure 14B:
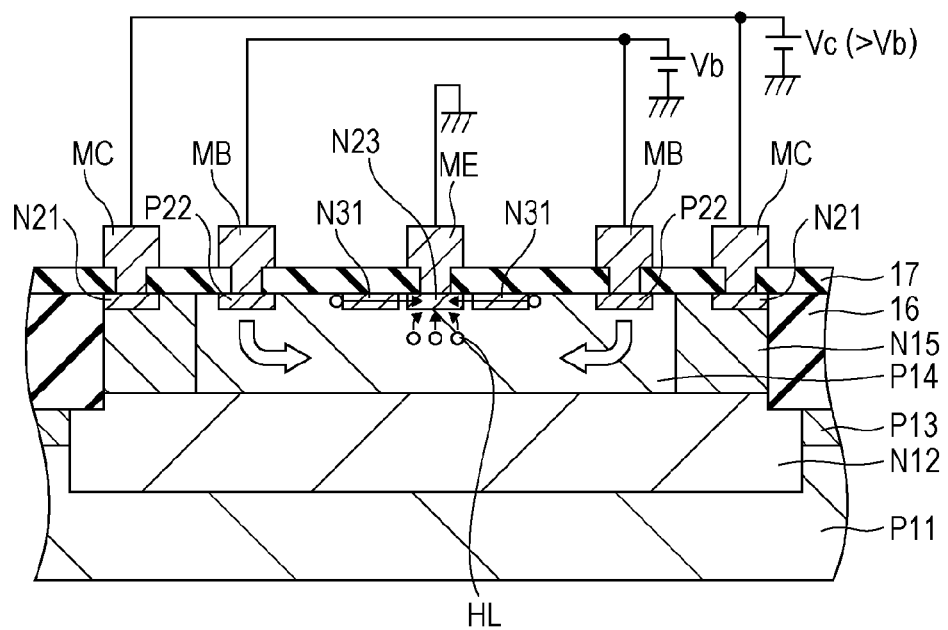

FIGS. 14A and 14B schematically show the detailed operation of the bipolar transistor 2. FIG. 14A shows the movement of electrons; FIG. 14B shows the movement of the positive holes.

First, the movement of electrons will be explained. In the bipolar transistor 2, as shown in FIG. 14A, the N+ source N23 (emitter) emits the electrons EL which are majority carriers, and these electrons are injected into P-well P14 (base). A portion of the electrons EL which are injected into the P-well P14 (base) diffuse in the direction of the N+ source N31, and reach the N+ source N31 arranged at a distance shorter than the diffusion length. In this way, N+ source N31 is conductive with the N+ source N23 (emitter), and because the potential of the emitter is transferred to the N+ source N31, similarly to between the P-well P14 (base) and N+ source N23 (emitter) being in a state of forward bias, between the P-well P14 (base) and N+ source N31 is also in a state of forward bias. Thus, in the bipolar transistor 2, as shown in FIG. 14A, electrons EL are emitted from not only the N+ source N23 (emitter), but also from N+ source N31 and are injected into the P-well P14 (base). That is, N+ source N31 functions as a second emitter.

Most of the electrons EL injected into the P-well P14 (base), similarly to any case of the first embodiment, diffuse in the P-well P14, and after reaching the vicinity of the boundary between the N-well N12 (collector) and P-well P14 (base), move to the N-well N12 (collector) side due to the reverse bias between the base and collector. In this way, collector current Ic occurs.

In this way, in the bipolar transistor 2, in addition to the N+ source N23, since the N+ source N31 is provided at a distance shorter than the diffusion length of electrons from the N+ source N23, electrons EL can be emitted from not only N+ source N23 (emitter), but also from the N+ source N31, and the collector current Ic is able to be increased.

Next, an explanation of the movement of the positive holes will be made. In the process of diffusion in the P-well P14, a portion of the electrons EL which are injected into the P-well P14 (base) from N+ source N23 and N31 recombine with the positive holes HL which are majority carriers of the P-well P14. In addition, positive holes HL are injected into the N+ sources N31 and N23 from the P-well P14 (base). Through this recombination and the injection of the positive holes HL into the emitter from the base, the base current Ib occurs. At this time, although a portion of the positive holes HL move towards the N+ source N31 from the P-well P14 (base), as shown in FIG. 14B and thereafter flow to the N+ source N23, the majority of the positive holes HL flow toward the N+ source N23 (emitter) from the P-well P14 (base), as shown in FIG. 14B. Thereby, the N+ source N31 is not connected to electrode (emitter electrode ME) as is the N+ source N23, because it is connected to the emitter electrode ME through the N+ source N23. In other words, because the N+ source N23 and the N+ source N31 are electrically connected to each other by the diffusion of electrons EL, the positive holes HL are to be connected via a high impedance. In this way, because the movement of the positive holes HL is suppressed between the N+ source N31 (second emitter) and N+ source N23 (emitter), the flow of the positive holes HL via the N+ source N31 from the P-well P14 (base) to N+ source N23 is suppressed, the majority thereof flows directly from the P-well P14 (base) to the N+ source N23 and thereby the base current Ib is able to be suppressed to be low.

As mentioned above, in the bipolar transistor 2, along with being able to increase the collector current Ic, the base current Ib can suppressed to be low. In so doing, as is clear from expression (1), it is possible to increase current amplification factor hFE, and to increase the hFE·VA product itself.

In the present embodiment as described above, since the N+ source N31 is provided at a distance from N+ source N23 shorter than the diffusion length of the electrons, the collector current Ic is able to be increased through the N+ source N31 functioning as a second emitter, and the current amplification factor is able to be increased.

Further, in the present embodiment, the distance between the N+ source N23 and the N+ source N31, since it is set to be shorter than the diffusion length of electrons, is able to efficiently transfer electrons, the movement of the positive holes is able to be restricted, and the current amplification factor is able to be increased.

Further, in the present embodiment, since the N+ source N31 is provided at a distance from the N+ source N23 shorter than the diffusion length of electrons, and the N+ source N31 functions as a second emitter without the application of a voltage from the outside, it is possible to increase the current amplification factor using a simple configuration.

Further, in the present embodiment, since the N+ source N31 is formed so as to encircle the N+ source N23, the current amplification factor is able to be effectively increased, similarly to the case of the first embodiment.

Further, in the present embodiment, since the current amplification factor is increased through such a configuration, the product itself of the Early voltage and current amplification factor is able to be increased, and both a high Early voltage and high current amplification factor are able to be achieved.

Further, in the present embodiment, rather than a change in the impurity profile, since the product itself of the Early voltage and current amplification factor is increased by such a configuration, even in a case of a bipolar transistor and a MOS transistor formed on the same chip, the product itself of the Early voltage and the current amplification factor is able to be increased while suppressing the influence of the MOS transistor.

Modification Example 2-1

For example, the modification examples 1-1 to 1-3 of the first embodiment may be applied to the present embodiment. Below, as an example, a case where the modification example 1-1 is applied to the present embodiment will be described.

Figure 15:
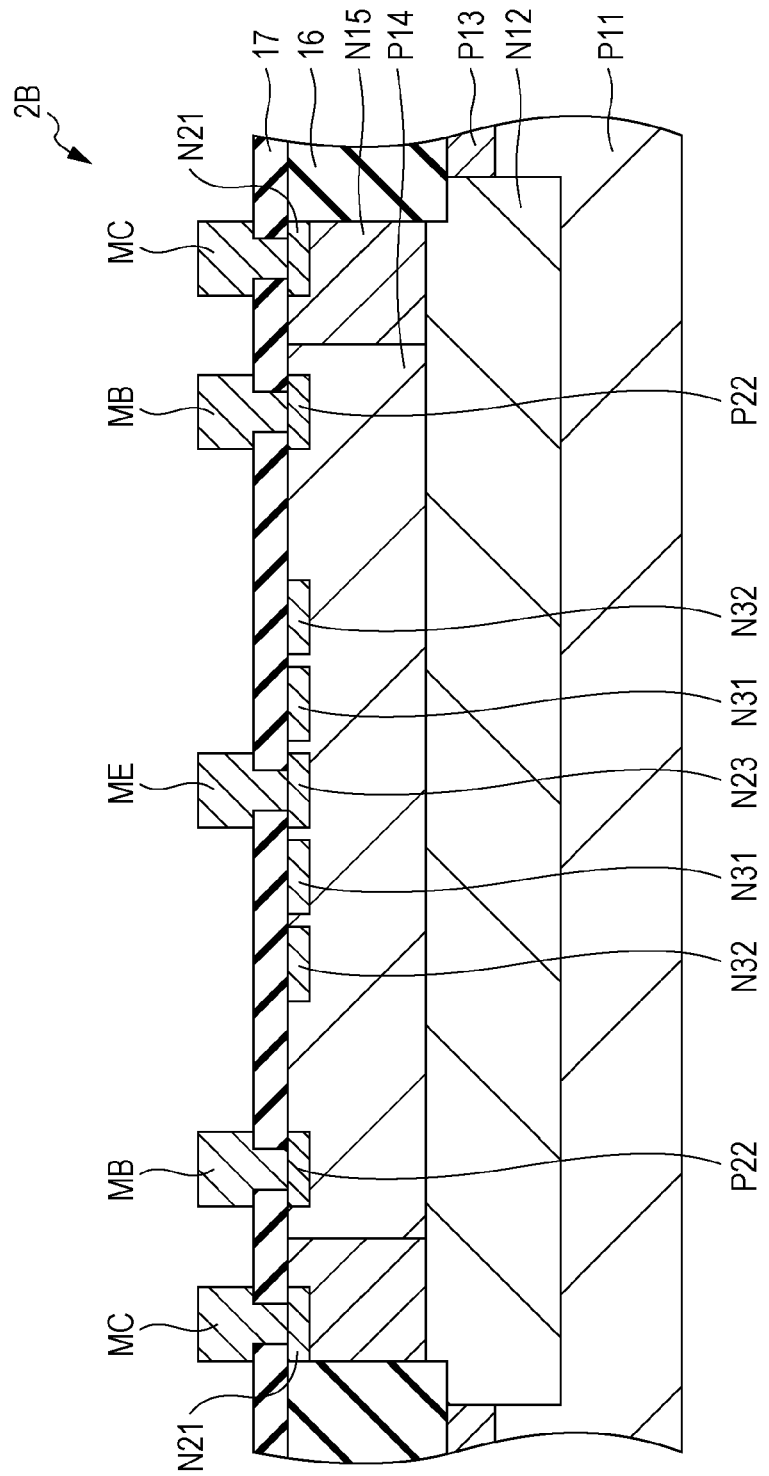
FIG. 15 is a cross-sectional view showing a configuration example of a bipolar transistor according to a modification example of the second embodiment.

FIG. 15 is a diagram showing an example of a cross-sectional configuration of a bipolar transistor 2B according to the present modification example. Bipolar transistor 2B is provided with an N+ source N32 which is an N-type diffusion layer. On the surface of the P-well P14, the N+ source N32 is formed spaced apart so as to encircle the N+ source N31, further to the outside than the N+ source N31 which encircles the N+ source N23. In the present example, the N+ source N32 is formed at the same time as and using the same process as N+ sources N23, N31 and N21. The gap between the N+ source N31 and N+ source N32 is shorter than the diffusion length of electrons in the P-well P14. Thereby, the N+ source N32 functions as a third emitter.

Thus, in the bipolar transistor 2B, through not only N+ source N23 (emitter), but also the N+ source N32 (third emitter) and the N+ source N31 (second emitter) releasing electrons EL, the base current Ib can be suppressed to be small while increasing the collector current Ic, due to the majority of the positive holes HL flowing directly to the N+ source N23 from the P-well P14. In this way, in the bipolar transistor 2B, it is possible to increase the current amplification factor hFE, and to increase the hFE·VA product itself.

3. Third Embodiment

Next, a description will be provided of a bipolar transistor 3 according to a third embodiment. In the present embodiment, in a bipolar transistor 1 according to the first embodiment, an N+ source according to a second embodiment is provided further to the outside of the N+ source N24 which functions as a second emitter. Those components that are substantially the same as in the bipolar transistor 1, 2 according to the first and second embodiments are given the same reference numerals, and explanations thereof are omitted as appropriate.

Figure 16:
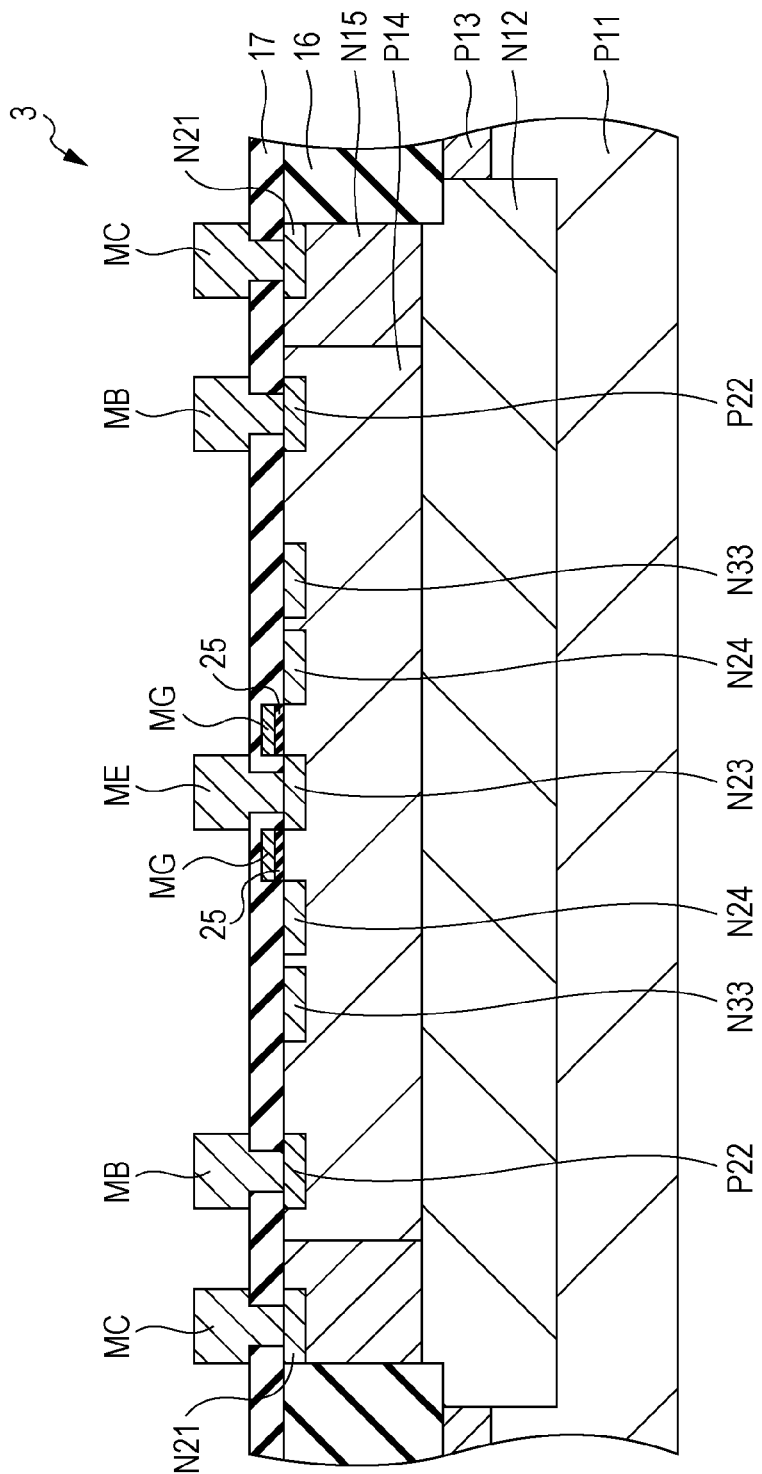
FIG. 16 is a cross-sectional view showing a configuration example of a bipolar transistor according to a third embodiment.

FIG. 16 is a diagram showing an example of a cross-sectional configuration of the bipolar transistor 3 according to the present embodiment. The bipolar transistor 3 is provided with an N+ source N33 which is an N-type diffusion layer. On the surface of the P-well P14, the N+ source N33, is formed spaced apart so as to encircle the N+ source N24 (second emitter). In the present example, the N+ source N33 is formed at the same time as and using the same process as N+ sources N23, N24 and N21. As will be described later, the distance between the N+ source N33 and N+ source N24 is shorter than the diffusion length in the P-well P14 of electrons that are injected into the P-well P14 from the N+ source N24. Thus, as will be described later, the N+ source N33 functions as a third emitter.

Here, similarly to the bipolar transistor 2 according to the second embodiment, a field oxide film 17 is formed on the N+ source N33 (third emitter), and the N+ source N33 is not directly connected to the electrode.

Figure 17A:
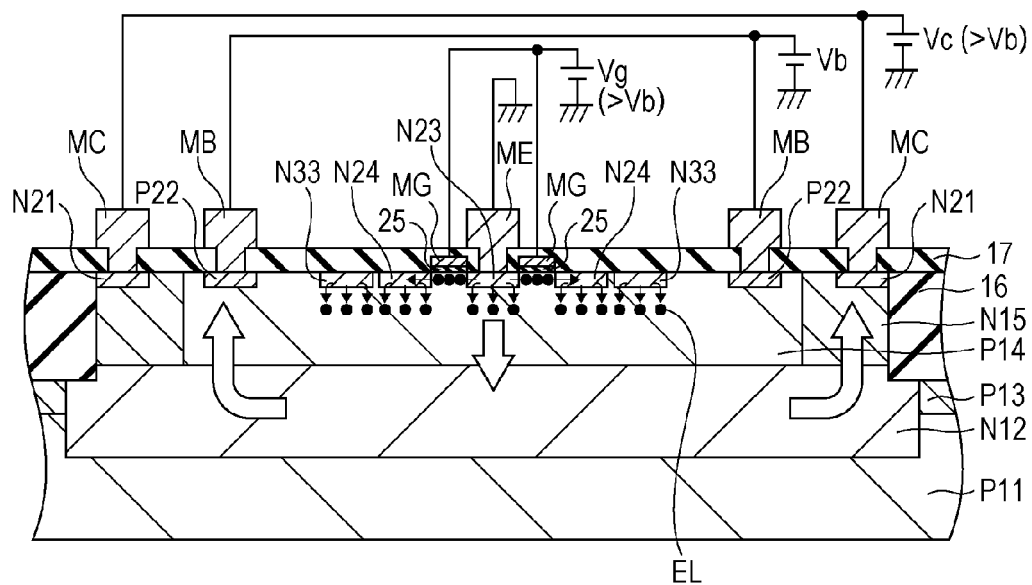
FIGS. 17A and 17B are explanatory diagrams showing an operation example of a bipolar transistor shown in FIG. 16.
Figure 17B:
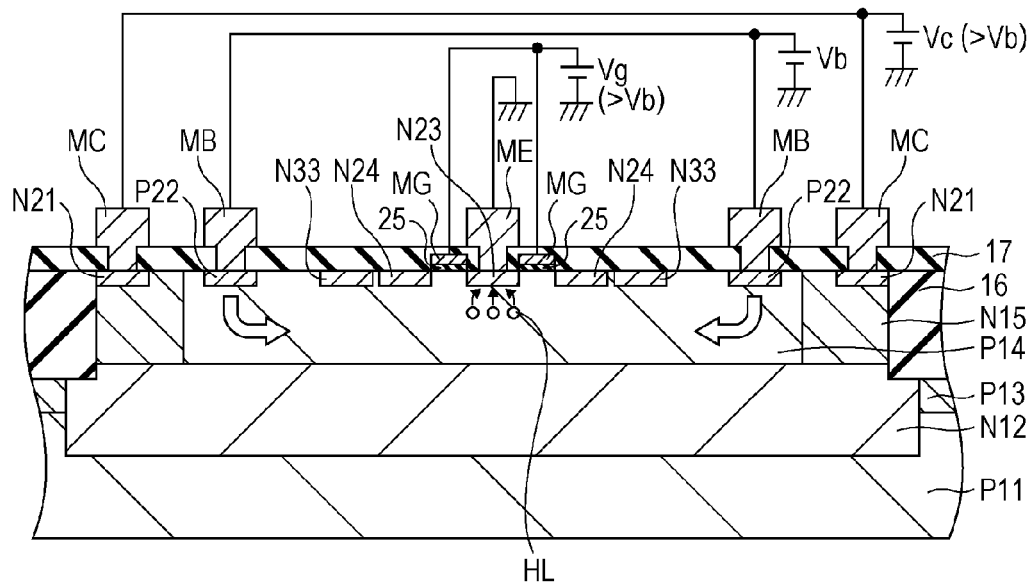

FIGS. 17A and 17B schematically show the detailed operation of the bipolar transistor 3. FIG. 17A shows the movement of electrons; FIG. 17B shows the movement of the positive holes.

First, the movement of electrons will be explained. In the bipolar transistor 3, as shown in FIG. 17A, the N+ source N23 (emitter) emits electrons EL which are majority carriers, and the electrons EL are injected into the P-well P14 (base). At the same time, similarly to the bipolar transistor 1 according to the first embodiment, a channel is formed in a region immediately below the gate electrode MG and the gate oxide film 25 in the P-well P14, and the N+ source N23 and N+ source N24 are conductive. Next, the N+ source N23 supplies the electrons EL with respect to the N+ source N24 via this channel, and the electrons EL are injected into P-well P14 (base) from N+ source N24. That is, the N+ source N24 functions as a second emitter. Furthermore, a portion of the electrons EL injected into the P-well P14 (base) from the N+ source N24 (second emitter), similarly to bipolar transistor 2 according to the second embodiment, diffuses in the direction of the N+ source N33, and by reaching the N+ source N33 arranged at a distance shorter than the diffusion length, the N+ source N24 (second emitter) and N+ source N33 become conductive. In this way, the N+ source N24 supplies the electrons EL with respect to the N+ source N33, and the electrons EL are injected into the P-well P14 (base) from the N+ source N33. That is, N+ source N33 functions as a third emitter.

In other words, in the bipolar transistor 3, the electrons EL are injected into P-well P14 (base) by three paths. That is, similarly to the bipolar transistor 1R of the related art, the first path is a path by which electrons EL are directly injected into the P-well P14 (base) from the N+ source N23 (emitter). The second path, similarly to the bipolar transistor 1 according to the first embodiment, is a path by which electrons EL are supplied from the N+ source N23 (emitter) to the N+ source N24 (second emitter) via a channel, and thereafter are injected into the P-well P14 (base) from the N+ source N24. And, the third path is a path by which electrons EL are supplied to the N+ source N33 (third emitter) from the N+ source N24 (second emitter), and are subsequently injected into the P-well P14 (base) from the N+ source N33.

The majority of electrons EL which are injected into P-well P14 (base), similarly to the case of the first embodiment, diffuse in the P-well P14, and after reaching the vicinity of the boundary between the P-well P14 (base) and the N-well N12 (collector), move to the N-well N12 (collector) side due to the reverse bias between the base and collector. In this way, the collector current Ic occurs.

In this way, in the bipolar transistor 2, in addition to the N+ source N23, since the N+ sources N24 and N33 are provided, it is possible to emit electrons EL not only from the N+ source N23 (emitter) but also from the N+ source N31, and to increase the collector current Ic.

Next, the movement of the positive holes will be explained. A portion of the electrons EL which are injected into P-well P14 (base) from the N+ sources N24, N33 and N23, in the process of diffusion in the P-well P14, recombine with the positive holes HL which are the majority carriers of the P-well P14. In addition, the positive holes HL are injected from the P-well P14 (base) into the N+ source N23 (emitter). Due to this recombination and the injection of positive holes HL into the emitter from the base, the base current Ib occurs. At this time, as shown in FIG. 17B, the positive holes HL flow from P-well P14 (base) toward the N+ source N23 (emitter) only, and do not flow towards the N+ source N24 (second emitter) or the N+ source N33 (third emitter). That is, similarly to the case of the first embodiment, the MOS structure between the N+ source N24 (second emitter) and N+ source N23 (emitter) is an N-type MOS structure, and although the structure can transfer the electrons EL, it may not be able to transfer the positive holes HL. Because the movement of the positive holes HL between the N+ source N33 (third emitter) and the N+ source N24 (second emitter) and N+ source N23 (emitter) is blocked, the positive holes HL flow from P-well P14 (base) toward the N+ source N23 (emitter) only, it is possible to suppress the base current Ib to be small.

As described above, in the bipolar transistor 3, as well as the collector current Ic being able to be increased, the base current Ib can be suppressed to be small. As a result, as is clear from expression (1), it is possible to increase the current amplification factor hFE, and to increase the hFE·VA product itself.

In the present embodiment as described above, the N+ source N33 is provided at a distance from the N+ source N24 shorter than the diffusion length of electrons, due to the N+ source N33 functioning as the third emitter, the collector current Ic is able to be increased, and the current amplification factor is able to be increased.

Further, in the present embodiment, since the MOS structure is provided only between the N+ source and N23 N+ source N24, it is possible to realize a simpler structure.

Other effects are the same as in the case of the first embodiment.

Modification Example 3-1

In the above-described embodiment, in the bipolar transistor 1 according to the first embodiment, further outside of the N+ source N24 which functions as a second emitter, an N+ source according to the second embodiment is provided, but is not limited thereto. For example, in place of this, in the bipolar transistor 2 according to a second embodiment, further outside of the N+ source N31 which function as a second emitter, the gate oxide film 25, gate electrode MG, and the N+ source N24 according to the first embodiment may be provided.

Modification Example 3-2

For example, modification examples 1-1 to 1-3 according to a first embodiment may be applied to the present embodiment.

Above, the present technology has been described with reference to several embodiments and modification examples, however the present technology is not limited to the embodiments and the like, and various modifications may be made.

For example, in each of the above embodiments, was the N+ source which functions as a second emitter was formed in a rectangular shape, but is not limited thereto, and instead, for example, may be formed in a polygonal shape, or may be formed as a circle.

Further, for example, in the above embodiments, an N+ source which functions as a second emitter is formed so as to encircle the N+ source N23 which functions as an emitter from all directions within the substrate surface, but is not limited thereto, and in lieu of this, for example, the N+ source may be formed so as to encircle from three directions.

In addition, for example, in each of the above embodiments, an N+ source which functions as a second emitter is formed so as to encircle the N+ source N23 which functions as an emitter, but is not limited thereto, and alternatively, for example, the N+ source which functions as a second emitter may be formed so as to extend in one direction. Below, an example of a case in which the present modification example is applied to the bipolar transistor 1 according to a first embodiment will be explained in detail.

Figure 18:
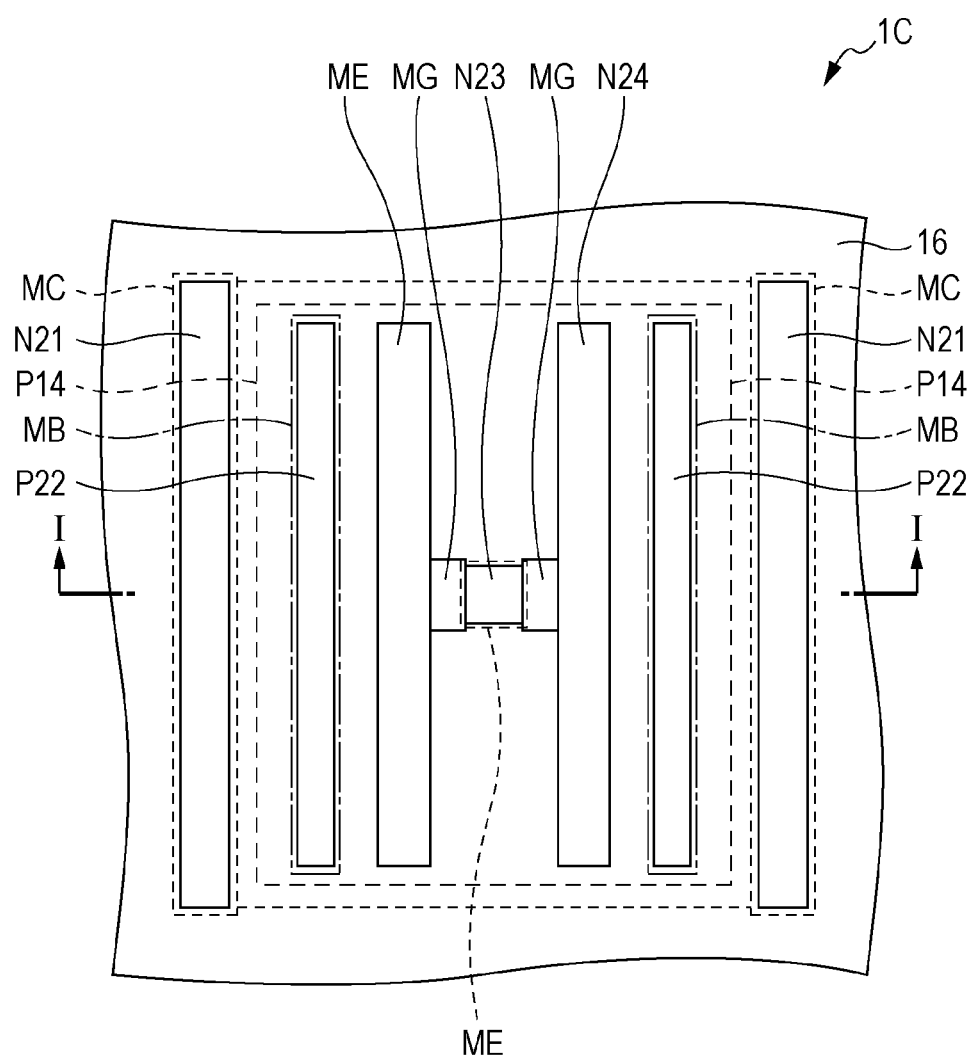
FIG. 18 is a cross-sectional view showing a configuration example of a bipolar transistor according to a modification example.

FIG. 18 is a diagram showing an example of a planar configuration of the bipolar transistor 1C according to the present modification example. The cross-sectional configuration taken along the line I-I in FIG. 18 is similar to that shown in FIG. 1. In the bipolar transistor 1C, as shown in FIG. 18, on the surface of the P-well P14, N+ source N24 which functions as a second emitter, P+ source P22 and N+ source N21, and the like are formed two at a time so as to stretch in the vertical direction of FIG. 18. These are arranged one by one to the left and right in FIG. 18, and interpose the N+ source N23 that is formed in the vicinity of the center of the surface of the P-well P14. More specifically, two N+ sources N24 are arranged to the left and right of the N+ source 23, so as to interpose the N+ source N23 which is formed in the vicinity of the center of the surface of the P-well P14. Further, two P+ sources P22 are arranged so as to interpose the two N+ sources N24 and the like, and further, two N+ sources N21 are arranged so as to interpose the two P+ sources P22. A gate electrode MG or the like is formed in the region between the N+ source N23 and N+ sources N24 which are formed on both sides thereof. Further, in the present example, the N+ source N24, P+ source P22 and N+ source N21 are formed so as to have a longer length in the stretching direction than the length of the N+ source N23 in the same direction.

Using this configuration, in the bipolar transistor 1C, similarly to the bipolar transistor 1 according to the embodiment, it is possible to increase the current amplification factor hFE and to increase the hFE·VA product itself.

Further, for example, in each of the embodiments, the bipolar transistor is a vertical transistor, but is not limited thereto, and may be, for example, a horizontal transistor instead.

Moreover, an embodiment of the present technology can be configured as follows.

(1) A semiconductor device including a first conductivity type base formed on the surface of a substrate, and a second conductivity type emitter formed on the surface of the base, and a second conductivity type doped region which, along with accepting the first type of carrier from the emitter, injects the first type of carrier into the base, and is arranged to be spaced apart on the surface of the base from the emitter, and a second conductivity type collector which is formed on the opposite side to the emitter and the doped region, interposing the base.

(2) The semiconductor device according to (1) including a gate electrode formed, via an insulating film, on the surface of the base between the emitter and the doped region.

(3) The semiconductor device according to (2), in which, during operation, on the surface of the base between the emitter and the doped region, a channel is formed through which the first type of carrier is transferred.

(4) The semiconductor device according to (1), in which the gap between the emitter and the doped region is shorter than the diffusion length of the first type of carrier in the base.

(5) The semiconductor device according to any one of (1) to (4), in which the emitter and the doped region have the same impurity profile in the depth direction.

(6) The semiconductor device according to any one of (1) to (5), in which the doped region is formed on the surface of the base so as to encircle the emitter.

(7) The semiconductor device according to any one of (1) to (5), in which the doped regions, along with being formed to stretch in one direction, are arranged in two rows interposing the emitter.

(8) The semiconductor device according to (7), in which the long side of the doped region is longer than the long side of the emitter.

(9) The semiconductor device according to any one of (1) to (8), in which a second conductivity type doped region, which along with receiving the first type of carrier from the doped region, injects the first type of carrier into the base, is arranged on the surface of the base on the opposite side of the emitter interposing the doped region, and arranged to be spaced apart from the doped region.

(10) The semiconductor device according to (9), in which the gap between the doped region and the other doped region is shorter than the diffusion length of the first type of carrier in the base.

(11) The semiconductor device according to any one of (1) to (10), in which the collector is formed below the base in the interior of the substrate.

(12) The semiconductor device according to any one of (1) to (11), in which the surface of the doped region is covered with an insulating film.

(13) The semiconductor device according to any one of (1) to (12), in which the first type of carrier is majority carriers in the emitter and the doped region.

The present disclosure contains subject matter related to that disclosed in Japanese Priority Patent Application JP 2011-235046 filed in the Japan Patent Office on Oct. 26, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A semiconductor device comprising:
    a first conductivity type base formed on a surface of a substrate;
    a second conductivity type emitter formed on a surface of the base;
    a second conductivity type doped region which, along with accepting a first type of carrier from the emitter, injects the first type of carrier into the base, and is arranged spaced apart on the surface of the base from the emitter; and
    a second conductivity type collector arranged on the surface of base with the doped region between the emitter and the second conductivity type collector.
2. The semiconductor device according to claim 1, further comprising a gate electrode, on the surface of the base between the emitter and the doped region and an insulating film between the base and the gate electrode.

3. The semiconductor device according to claim 2, wherein, during operation, on the surface of the base between the emitter and the doped region, a channel is formed through which the first type of carrier is transferred.

4. The semiconductor device according to claim 1, wherein a gap between the emitter and the doped region is shorter than a diffusion length of the first type of carrier in the base.

5. The semiconductor device according to claim 1, wherein the emitter and the doped region have the same impurity profiles in a depth direction.

6. The semiconductor device according to claim 1, wherein the doped region is formed on the surface of the base so as to encircle the emitter.

7. The semiconductor device according to claim 1, wherein the doped region, along with being formed to stretch in one direction, is arranged in two rows interposing the emitter.

8. The semiconductor device according to claim 7, wherein a long side of the doped region is longer than a long side of the emitter.

9. The semiconductor device according to claim 1, further comprising another second conductivity type doped region, which along with receiving the first type of carrier from the doped region, injects the first type of carrier into the base, is arranged on the surface of the base spaced apart from the doped region and between the doped region and the second conductivity type collector.

10. The semiconductor device according to claim 9, wherein a gap between the doped region and the other doped region is shorter than a diffusion length of the first type of carrier in the base.

11. A semiconductor device comprising:
a first conductivity type base formed on a surface of a substrate;
a second conductivity type emitter formed on a surface of the base;
a second conductivity type doped region which, along with accepting a first type of carrier from the emitter, injects the first type of carrier into the base, and is arranged spaced apart on the surface of the base from the emitter;
a second conductivity type collector arranged on the surface of base with the doped region between the emitter and the second conductivity type collector
another second conductivity type doped region, which along with receiving the first type of carrier from the doped region, injects the first type of carrier into the base, is arranged on the surface of the base spaced apart from the doped region and between the doped region and the second conductivity type collector and
a gate electrode, on the surface of the base between the emitter and the doped region and an insulating film between the base and the gate electrode,
wherein,
a gap between the doped region and the other doped region is shorter than a diffusion length of the first type of carrier in the base.

12. The semiconductor device according to claim 1, wherein the collector is formed below the base in an interior of the substrate.

13. The semiconductor device according to claim 1, wherein the surface of the doped region is covered with an insulating film.

14. The semiconductor device according to claim 1, wherein the first type of carrier is majority carriers in the emitter and the doped region.

* * * * *